US012580126B2

(12) United States Patent
Berolini

(10) Patent No.: US 12,580,126 B2
(45) Date of Patent: Mar. 17, 2026

(54) MULTILAYER CAPACITOR HAVING INTERNAL ELECTRODES WITH LEAD TABS

(71) Applicant: KYOCERA AVX Components Corporation, Fountain Inn, SC (US)

(72) Inventor: Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 100 days.

(21) Appl. No.: 18/494,797

(22) Filed: Oct. 26, 2023

(65) Prior Publication Data

US 2024/0145169 A1 May 2, 2024

Related U.S. Application Data

(60) Provisional application No. 63/420,724, filed on Oct. 31, 2022.

(51) Int. Cl.
*H01G 4/012* (2006.01)
*H01G 4/232* (2006.01)
(Continued)

(52) U.S. Cl.
CPC ........... *H01G 4/012* (2013.01); *H01G 4/2325* (2013.01); *H01G 4/30* (2013.01); *H05K 1/181* (2013.01);
(Continued)

(58) Field of Classification Search
CPC ........ H01G 4/012; H01G 4/2325; H01G 4/30; H01G 4/12; H01G 4/232; H05K 1/181; H05K 2201/10015; H10D 1/68
See application file for complete search history.

(56) References Cited

U.S. PATENT DOCUMENTS 4,831,494 A 5/1989 Arnold et al.
5,583,738 A 12/1996 Kohno
(Continued)

FOREIGN PATENT DOCUMENTS

EP 2689455 B1 8/2016
EP 2614521 B1 1/2018
(Continued)

OTHER PUBLICATIONS

AVX, LGA Low Inductance Capacitors 0204/0306 Land Grid Array, p. 85-86.
(Continued)

*Primary Examiner* — Timothy J. Dole
*Assistant Examiner* — Daniel M Dubuisson
(74) *Attorney, Agent, or Firm* — Dority & Manning, P.A.

(57) ABSTRACT

The present invention is directed to a multilayer capacitor, a circuit board containing the multilayer capacitor, and an integrated circuit package containing the multilayer capacitor. A multilayer capacitor includes a body containing alternating dielectric layers and internal electrode layers that each include a first electrode and a second, co-planar electrode, the first electrode having a main body with at least one lead tab extending from each of a top edge and a bottom edge thereof. The capacitor also includes a first external terminal and a second external terminal that each wrap from a top surface, along an end surface, to a bottom surface. The first external terminal is electrically connected to the first electrode of the first internal electrode layers along its lead tab leading edges, and the second external terminal is electrically connected to the first electrode of the second internal electrode layers along its lead tab leading edges.

31 Claims, 8 Drawing Sheets

(51) Int. Cl.

| | |
|---|---|
| *H01G 4/30* | (2006.01) |
| *H05K 1/181* | (2026.01) |
| *H10D 1/68* | (2025.01) |

(52) U.S. Cl.

CPC ..... *H05K 2201/10015* (2013.01); *H10D 1/68* (2025.01)

(56) References Cited

U.S. PATENT DOCUMENTS

| | | | |
|---|---|---|---|
| 5,880,925 | A | 3/1999 | DuPre et al. |
| 6,034,864 | A | 3/2000 | Naito et al. |
| 6,075,285 | A | 6/2000 | Taylor et al. |
| 6,243,253 | B1 | 6/2001 | DuPre et al. |
| 6,292,351 | B1 | 9/2001 | Ahiko et al. |
| 6,407,907 | B1 | 6/2002 | Ahiko et al. |
| 6,430,059 | B1 | 8/2002 | Hung et al. |
| 6,456,561 | B2 | 9/2002 | Maeda |
| 6,459,561 | B1 | 10/2002 | Galvagni et al. |
| 6,477,032 | B2 | 11/2002 | Makl, Jr. |
| 6,496,355 | B1 | 12/2002 | Galvagni et al. |
| 6,532,143 | B2 | 3/2003 | Figueroa et al. |
| 6,594,136 | B2 | 7/2003 | Kuroda et al. |
| 6,606,237 | B1 | 8/2003 | Naito et al. |
| 6,664,628 | B2 | 12/2003 | Khandros et al. |
| 6,752,152 | B2 | 6/2004 | Gale et al. |
| 6,757,152 | B2 | 6/2004 | Galvagni et al. |
| 6,795,294 | B2 | 9/2004 | Kuroda et al. |
| 6,795,295 | B2 | 9/2004 | Murakami et al. |
| 6,816,356 | B2 | 11/2004 | Devoe et al. |
| 6,829,134 | B2 | 12/2004 | Yamauchi et al. |
| 6,898,070 | B2 | 5/2005 | Korony et al. |
| 6,909,593 | B2 | 6/2005 | Kuroda et al. |
| 6,950,300 | B2 | 9/2005 | Sutardja |
| 6,960,366 | B2 | 11/2005 | Ritter et al. |
| 6,970,362 | B1 | 11/2005 | Chakravorty |
| 7,068,490 | B2 | 6/2006 | Prymak |
| 7,149,072 | B2 | 12/2006 | Lee et al. |
| 7,170,737 | B2 | 1/2007 | MacNeal et al. |
| 7,177,137 | B2 | 2/2007 | Ritter et al. |
| 7,230,816 | B2 | 6/2007 | Sutardja |
| 7,251,116 | B2 | 7/2007 | Roy |
| 7,280,342 | B1 | 10/2007 | Randall et al. |
| 7,310,217 | B2 | 12/2007 | Takashima et al. |
| 7,317,622 | B2 | 1/2008 | Li |
| 7,327,554 | B2 | 2/2008 | Otsuka et al. |
| 7,365,957 | B2 | 4/2008 | Togashi et al. |
| 7,394,645 | B2 | 7/2008 | Takahashi |
| 7,414,857 | B2 | 8/2008 | Ritter et al. |
| 7,417,857 | B2 | 8/2008 | Rondier et al. |
| 7,463,474 | B2 | 12/2008 | Ritter et al. |
| 7,545,623 | B2 | 6/2009 | Randall et al. |
| 7,573,698 | B2 | 8/2009 | Eggerding et al. |
| 7,576,968 | B2 | 8/2009 | Ritter et al. |
| 7,633,739 | B2 | 12/2009 | Devoe |
| 7,662,430 | B2 | 2/2010 | Satou |
| 7,667,950 | B2 | 2/2010 | Togashi |
| 7,672,112 | B2 | 3/2010 | Hattori et al. |
| 7,697,262 | B2 | 4/2010 | Ritter et al. |
| 7,701,695 | B2 | 4/2010 | Sutardja |
| 7,715,171 | B2 | 5/2010 | Nakano et al. |
| 7,724,496 | B2 | 5/2010 | Eggerding et al. |
| 7,724,498 | B2 | 5/2010 | Mosley et al. |
| 7,732,296 | B2 | 6/2010 | Park et al. |
| 7,733,628 | B2 | 6/2010 | Lee et al. |
| 7,737,563 | B2 | 6/2010 | Su et al. |
| 7,791,192 | B1 | 9/2010 | Joshi et al. |
| 7,897,433 | B2 | 3/2011 | Su et al. |
| 7,958,627 | B2 | 6/2011 | Randall et al. |
| 7,961,453 | B2 | 6/2011 | Lee et al. |
| 7,990,677 | B2 | 8/2011 | Lee et al. |
| 8,004,820 | B2 | 8/2011 | Itamura |
| 8,045,319 | B2 | 10/2011 | Ritter et al. |
| 8,054,607 | B2 | 11/2011 | Lee et al. |
| 8,084,297 | B1 | 12/2011 | Joshi et al. |
| 8,111,524 | B2 | 2/2012 | Randall et al. |
| 8,159,813 | B2 | 4/2012 | Lee et al. |
| 8,193,039 | B2 | 6/2012 | Su et al. |
| 8,203,198 | B2 | 6/2012 | Shioga et al. |
| 8,238,116 | B2 | 8/2012 | Eggerding et al. |
| 8,267,718 | B2 | 9/2012 | Straka et al. |
| 8,293,636 | B2 | 10/2012 | Schulze et al. |
| 8,299,633 | B2 | 10/2012 | Su |
| 8,338,961 | B2 | 12/2012 | Su et al. |
| 8,394,672 | B2 | 3/2013 | Su et al. |
| 8,446,705 | B2 | 5/2013 | Ritter et al. |
| 8,451,014 | B2 | 5/2013 | Black et al. |
| 8,456,791 | B2 | 6/2013 | Jones et al. |
| 8,472,190 | B2 | 6/2013 | Refai-Ahmed et al. |
| 8,574,965 | B2 | 11/2013 | Refai-Ahmed et al. |
| 8,624,404 | B1 | 1/2014 | Su et al. |
| 8,647,974 | B2 | 2/2014 | Topacio et al. |
| 8,691,626 | B2 | 4/2014 | Su et al. |
| 8,704,353 | B2 | 4/2014 | Su et al. |
| 8,717,774 | B2 | 5/2014 | Randall et al. |
| 8,723,314 | B2 | 5/2014 | Su et al. |
| 8,730,646 | B2 | 5/2014 | Kawasaki et al. |
| 8,759,962 | B2 | 6/2014 | Su |
| 8,796,842 | B2 | 8/2014 | Refai-Ahmed et al. |
| 8,816,474 | B2 | 8/2014 | Hanke et al. |
| 8,866,276 | B2 | 10/2014 | Su et al. |
| 8,917,491 | B2 | 12/2014 | Masuda et al. |
| 9,142,468 | B2 | 9/2015 | Bower et al. |
| 9,177,724 | B2 | 11/2015 | Abe et al. |
| 9,214,283 | B2 | 12/2015 | Togashi |
| 9,263,186 | B2 | 2/2016 | Li et al. |
| 9,330,849 | B2 | 5/2016 | Gong et al. |
| 9,343,236 | B2 | 5/2016 | Kim et al. |
| 9,385,055 | B2 | 7/2016 | Refai-Ahmed et al. |
| 9,425,121 | B2 | 8/2016 | Tsai et al. |
| 9,426,891 | B2 | 8/2016 | Tsai et al. |
| 9,437,561 | B2 | 9/2016 | Black et al. |
| 9,449,907 | B2 | 9/2016 | Fu et al. |
| 9,472,343 | B2 | 10/2016 | Ahn et al. |
| 9,478,474 | B2 | 10/2016 | Chen et al. |
| 9,524,826 | B2 | 12/2016 | Choi |
| 9,530,564 | B2 | 12/2016 | Yao |
| 9,613,755 | B2 | 4/2017 | Oh et al. |
| 9,627,281 | B2 | 4/2017 | Prejean et al. |
| 9,660,008 | B2 | 5/2017 | Bower et al. |
| 9,666,366 | B2 | 5/2017 | Ritter et al. |
| 9,787,437 | B2 | 10/2017 | Feng et al. |
| 9,793,239 | B2 | 10/2017 | Su et al. |
| 9,806,014 | B2 | 10/2017 | Alfano et al. |
| 9,837,215 | B2 | 12/2017 | Lee et al. |
| 9,837,352 | B2 | 12/2017 | Chang et al. |
| 9,847,173 | B2 | 12/2017 | Taniguchi et al. |
| 9,847,299 | B2 | 12/2017 | Teshima et al. |
| 9,960,146 | B1 | 5/2018 | Lin |
| 9,997,467 | B2 | 6/2018 | Shao et al. |
| 10,014,112 | B2 | 7/2018 | Azuma et al. |
| 10,083,795 | B2 | 9/2018 | Itamura |
| 10,109,576 | B2 | 10/2018 | Tanaka |
| 10,128,048 | B2 | 11/2018 | Park et al. |
| 10,135,416 | B2 | 11/2018 | Chong et al. |
| 10,163,735 | B2 | 12/2018 | Bower et al. |
| 10,204,737 | B2 | 2/2019 | Ritter et al. |
| 10,229,789 | B2 | 3/2019 | Park et al. |
| 10,304,628 | B2 | 5/2019 | Hwang et al. |
| 10,306,770 | B2 | 5/2019 | Hattori |
| 10,366,835 | B2 | 7/2019 | Ritter et al. |
| 10,395,837 | B2 | 8/2019 | Chong et al. |
| 10,418,180 | B2 | 9/2019 | Kageyama et al. |
| 10,418,331 | B2 | 9/2019 | Bower |
| 10,424,438 | B2 | 9/2019 | Martinex et al. |
| 10,468,363 | B2 | 11/2019 | Prevatte et al. |
| 10,490,540 | B2 | 11/2019 | Yu et al. |
| 10,522,352 | B2 | 12/2019 | Delacruz et al. |
| 10,593,618 | B2 | 3/2020 | Cheah et al. |
| 10,672,563 | B2 | 6/2020 | Cain |
| 10,707,145 | B2 | 7/2020 | Bultitude et al. |
| 10,756,025 | B2 | 8/2020 | Lee et al. |
| 10,832,912 | B2 | 11/2020 | Delacruz et al. |
| 10,943,735 | B2 | 3/2021 | Horn et al. |
| 10,943,869 | B2 | 3/2021 | Zhai et al. |

(56) References Cited

U.S. PATENT DOCUMENTS

| | | | |
|---|---|---|---|
| 10,998,261 | B2 | 5/2021 | Kong et al. |
| 11,017,949 | B2 | 5/2021 | Kato et al. |
| 11,121,074 | B2 | 9/2021 | Cheah et al. |
| 11,139,115 | B2 | 10/2021 | Cain |
| 11,239,174 | B2 | 2/2022 | Lu |
| 11,276,660 | B2 | 3/2022 | Lee |
| 11,289,333 | B2 | 3/2022 | Delacruz et al. |
| 11,296,043 | B2 | 4/2022 | Kung et al. |
| 11,302,644 | B2 | 4/2022 | Lu |
| 11,302,647 | B2 | 4/2022 | Chen et al. |
| 11,309,295 | B2 | 4/2022 | Huang et al. |
| 11,322,428 | B2 | 5/2022 | Yen et al. |
| 11,342,272 | B2 | 5/2022 | Hsu et al. |
| 11,342,282 | B2 | 5/2022 | Shih et al. |
| 11,348,885 | B2 | 5/2022 | Kung et al. |
| 11,362,026 | B2 | 6/2022 | Kuo et al. |
| 11,362,036 | B2 | 6/2022 | Liu |
| 11,373,809 | B2 | 6/2022 | Berolini et al. |
| 11,393,775 | B2 | 7/2022 | Hsieh et al. |
| 11,404,386 | B2 | 8/2022 | Cheng et al. |
| 11,437,192 | B2 | 9/2022 | Kim et al. |
| 11,437,247 | B2 | 9/2022 | Essig et al. |
| 11,443,997 | B2 | 9/2022 | Cho et al. |
| 11,469,186 | B2 | 10/2022 | Tien et al. |
| 11,469,212 | B2 | 10/2022 | Black et al. |
| 11,495,531 | B2 | 11/2022 | Kim et al. |
| 11,508,668 | B2 | 11/2022 | Kung et al. |
| 11,538,760 | B2 | 12/2022 | Lu |
| 11,538,778 | B2 | 12/2022 | Fang |
| 11,545,406 | B2 | 1/2023 | Yen et al. |
| 11,545,426 | B2 | 1/2023 | Chou |
| 11,562,978 | B2 | 1/2023 | Pon et al. |
| 11,621,217 | B2 | 4/2023 | Shih et al. |
| 11,626,363 | B2 | 4/2023 | Haba et al. |
| 11,636,978 | B2 | 4/2023 | Cain |
| 11,637,055 | B2 | 4/2023 | Tai et al. |
| 11,676,912 | B2 | 6/2023 | Huang et al. |
| 11,682,656 | B2 | 6/2023 | Yen et al. |
| 11,699,682 | B2 | 7/2023 | Lu |
| 11,710,675 | B2 | 7/2023 | Fang |
| 11,721,488 | B3 | 8/2023 | Horn et al. |
| 11,721,652 | B2 | 8/2023 | Lu |
| 11,721,679 | B2 | 8/2023 | Jung et al. |
| 11,728,294 | B2 | 8/2023 | Collins et al. |
| 11,756,896 | B2 | 9/2023 | Kung et al. |
| 11,756,948 | B2 | 9/2023 | Sounart et al. |
| 11,764,179 | B2 | 9/2023 | Lin |
| 11,784,152 | B2 | 10/2023 | Chu et al. |
| 11,823,906 | B2 | 11/2023 | DeLaCruz et al. |
| 11,837,405 | B2 | 12/2023 | Berolini et al. |
| 11,837,557 | B2 | 12/2023 | Yang et al. |
| 11,848,160 | B2 | 12/2023 | Kobayashi et al. |
| 11,848,296 | B2 | 12/2023 | Yen et al. |
| 11,862,525 | B2 | 1/2024 | Lin et al. |
| 11,887,967 | B2 | 1/2024 | Wu et al. |
| 11,997,888 | B2 | 5/2024 | Chen et al. |
| 12,027,467 | B2 | 7/2024 | Cho et al. |
| 12,033,982 | B2 | 7/2024 | Zhai |
| 12,074,118 | B2 | 8/2024 | Huang et al. |
| 12,100,697 | B2 | 9/2024 | Lin et al. |
| 12,148,679 | B2 | 11/2024 | Pi |
| 12,170,241 | B2 | 12/2024 | Kuo et al. |
| 12,176,297 | B2 | 12/2024 | Hsieh et al. |
| 12,506,116 | B2 | 12/2025 | Lin et al. |
| 2004/0125580 | A1 | 7/2004 | Chung et al. |
| 2007/0035014 | A1 | 2/2007 | Fung |
| 2007/0096254 | A1 | 5/2007 | Ritter et al. |
| 2007/0103846 | A1* | 5/2007 | Eggerding ............... H01G 4/40 |
| | | | 361/306.3 |
| 2008/0001253 | A1* | 1/2008 | Mosley .................. H01G 4/232 |
| | | | 257/532 |
| 2008/0186650 | A1 | 8/2008 | Beker |
| 2008/0253059 | A1* | 10/2008 | Eggerding ............... H01G 4/30 |
| | | | 29/25.42 |

| | | | |
|---|---|---|---|
| 2009/0244807 | A1 | 10/2009 | Lee et al. |
| 2010/0039749 | A1* | 2/2010 | Ritter ..................... H01G 4/005 |
| | | | 29/25.42 |
| 2010/0188799 | A1 | 7/2010 | Galvagni et al. |
| 2011/0056735 | A1* | 3/2011 | Lee .......................... H01G 4/30 |
| | | | 361/301.4 |
| 2013/0002388 | A1 | 1/2013 | Kim et al. |
| 2013/0094157 | A1 | 4/2013 | Guiliano |
| 2013/0201615 | A1 | 8/2013 | Arnold et al. |
| 2013/0256913 | A1 | 10/2013 | Black et al. |
| 2014/0293501 | A1 | 10/2014 | Jeong |
| 2015/0014037 | A1 | 1/2015 | Ahn et al. |
| 2015/0016016 | A1 | 1/2015 | Lee et al. |
| 2015/0243438 | A1 | 8/2015 | Ahn et al. |
| 2015/0294791 | A1 | 10/2015 | Hwang et al. |
| 2016/0126013 | A1 | 5/2016 | Park et al. |
| 2016/0240317 | A1 | 8/2016 | Ro et al. |
| 2017/0012029 | A1 | 1/2017 | Lambert et al. |
| 2017/0208690 | A1* | 7/2017 | Martinez ................ H01G 4/232 |
| 2018/0158772 | A1 | 6/2018 | Tanaka |
| 2018/0330880 | A1 | 11/2018 | Cain |
| 2018/0330881 | A1* | 11/2018 | Cain ...................... H01G 4/012 |
| 2019/0080982 | A1 | 3/2019 | Bultitude et al. |
| 2019/0279820 | A1* | 9/2019 | Horn .................... H01G 4/1227 |
| 2020/0075571 | A1 | 3/2020 | Chen et al. |
| 2022/0157709 | A1 | 5/2022 | Shih et al. |
| 2023/0019800 | A1 | 1/2023 | Cain |
| 2024/0145172 | A1 | 5/2024 | Berolini |
| 2024/0145176 | A1 | 5/2024 | Berolini |
| 2024/0145449 | A1 | 5/2024 | Desclos |
| 2024/0145451 | A1 | 5/2024 | Desclos |
| 2024/0145452 | A1 | 5/2024 | Desclos |
| 2024/0145528 | A1 | 5/2024 | Desclos |
| 2024/0145529 | A1 | 5/2024 | Desclos |
| 2024/0265305 | A1 | 8/2024 | DeLaCruz et al. |
| 2024/0363505 | A1 | 10/2024 | Kuo et al. |
| 2024/0429157 | A1 | 12/2024 | Desclos |
| 2024/0429182 | A1 | 12/2024 | Desclos |

FOREIGN PATENT DOCUMENTS

| | | | |
|---|---|---|---|
| JP | 2004304159 A | | 10/2004 |
| JP | 2005039005 A | | 2/2005 |
| JP | 2005150283 A | | 6/2005 |
| JP | 2008022017 | | 1/2008 |
| JP | 2008085054 A | | 4/2008 |
| JP | 2009081183 A | | 4/2009 |
| JP | 2010183025 A | | 8/2010 |
| JP | 2010199269 A | | 9/2010 |
| JP | 2018520507 A | | 7/2018 |
| KR | 20050038438 A | * | 4/2005 |
| KR | 20050089493 A | | 9/2005 |
| KR | 20070081537 A | | 8/2007 |
| KR | 101539884 | | 7/2015 |
| KR | 102387826 B1 | | 4/2022 |
| KR | 102393946 B1 | | 5/2022 |
| WO | WO 2024/097034 | | 5/2024 |

OTHER PUBLICATIONS

AVX, Low Inductance Capacitors, p. 1-12, http://www.avxcorp. com.

Brown, Land Grid Array (LGA) Low Inductance Capacitor Advantages in Military and Aerospace Applications, 5 pages.

Cantlebary, AVX Corporation, Technical Information, LICA (Low Inductance Capacitor Array Flip-Chip Application Notes, 14 pages.

Kyocera AVX, Low Inductance Capacitors, Surface Mount Ceramic Capacitor Products, p. 75-78.

Lau, "Chiplet Heterogeneous Integration" Semiconductor Advanced Packaging, 2021, pp. 413-439.

International Search Report and Written Opinion for PCT/US2023/ 035668 dated Feb. 6, 2024, 10 pages.

* cited by examiner

MULTILAYER CAPACITOR HAVING INTERNAL ELECTRODES WITH LEAD TABS

RELATED APPLICATION

The present application is based upon and claims priority to U.S. Provisional Patent Application Ser. No. 63/420,724, having a filing date of Oct. 31, 2022, which is incorporated herein by reference.

BACKGROUND OF THE SUBJECT MATTER

Multilayer capacitors are generally constructed having a plurality of dielectric layers and internal electrode layers arranged in a stack. During manufacture, the stacked dielectric layers and internal electrode layers are pressed and sintered to achieve a substantially unitary capacitor body. In an attempt to improve upon the performance of these capacitors, various configurations and designs have been employed for the dielectric layers and the internal electrode layers.

However, as rapid changes occur in the electronics industry requiring new performance criteria, these configurations are commonly manipulated. In particular, various application design considerations have created a need to redefine the capacitor parameters and its performance in high-speed environments, especially in light of faster and denser integrated circuits. For instance, larger currents, denser circuit boards, and spiraling costs have all served to focus upon the need for better and more efficient capacitors. Additionally, the design of various electronic components has been driven by a general industry trend toward miniaturization, as well as increased functionality.

In such regard, a need exists for providing a capacitor with improved operational characteristics.

SUMMARY OF THE SUBJECT MATTER

In accordance with one embodiment of the present invention, a multilayer capacitor is disclosed. The multilayer capacitor comprises a body having a length extending in a longitudinal direction, a width extending in a lateral direction, and a height extending in a vertical direction. The body contains alternating dielectric layers and internal electrode layers. The internal electrode layers include first internal electrode layers and second internal electrode layers. Each internal electrode layer includes a first electrode having a main body defined by a top edge extending along the longitudinal direction, a bottom edge opposite the top edge along the height direction and extending along the longitudinal direction, and two side edges extending along the height direction between the top edge and the bottom edge. Each internal electrode layer further includes at least one lead tab extending from the top edge of the main body. The at least one lead tab extends from the top edge along the height direction and has a leading edge extending along the longitudinal direction and spaced apart from the main body along the height direction. Each internal electrode layer also includes at least one lead tab extending from the bottom edge of the main body. The at least one lead tab extends from the bottom edge along the height direction and has a leading edge extending along the longitudinal direction and spaced apart from the main body along the height direction. Each internal electrode layer further includes a second electrode co-planar with the first electrode. The multilayer capacitor also includes external terminals electrically connected to the internal electrode layers. The external terminals include a first external terminal and a second external terminal. Each of the first external terminal and the second external terminal is formed on a top surface of the multilayer capacitor, a bottom surface of the multilayer capacitor opposing the top surface of the multilayer capacitor along the height direction, and an end surface extending between the top surface and the bottom surface. The first external terminal is electrically connected to the first electrode of the first internal electrode layers along the leading edge of the at least one lead tab extending from the top edge and the leading edge of the at least one lead tab extending from the bottom edge, and the first external terminal is also electrically connected to the second electrode of the second internal electrode layers. The second external terminal is electrically connected to the second electrode of the first internal electrode layers and the first electrode of the second internal electrode layers along the leading edge of the at least one lead tab extending from the top edge and the leading edge of the at least one lead tab extending from the bottom edge.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE SUBJECT MATTER

Figure 1A:
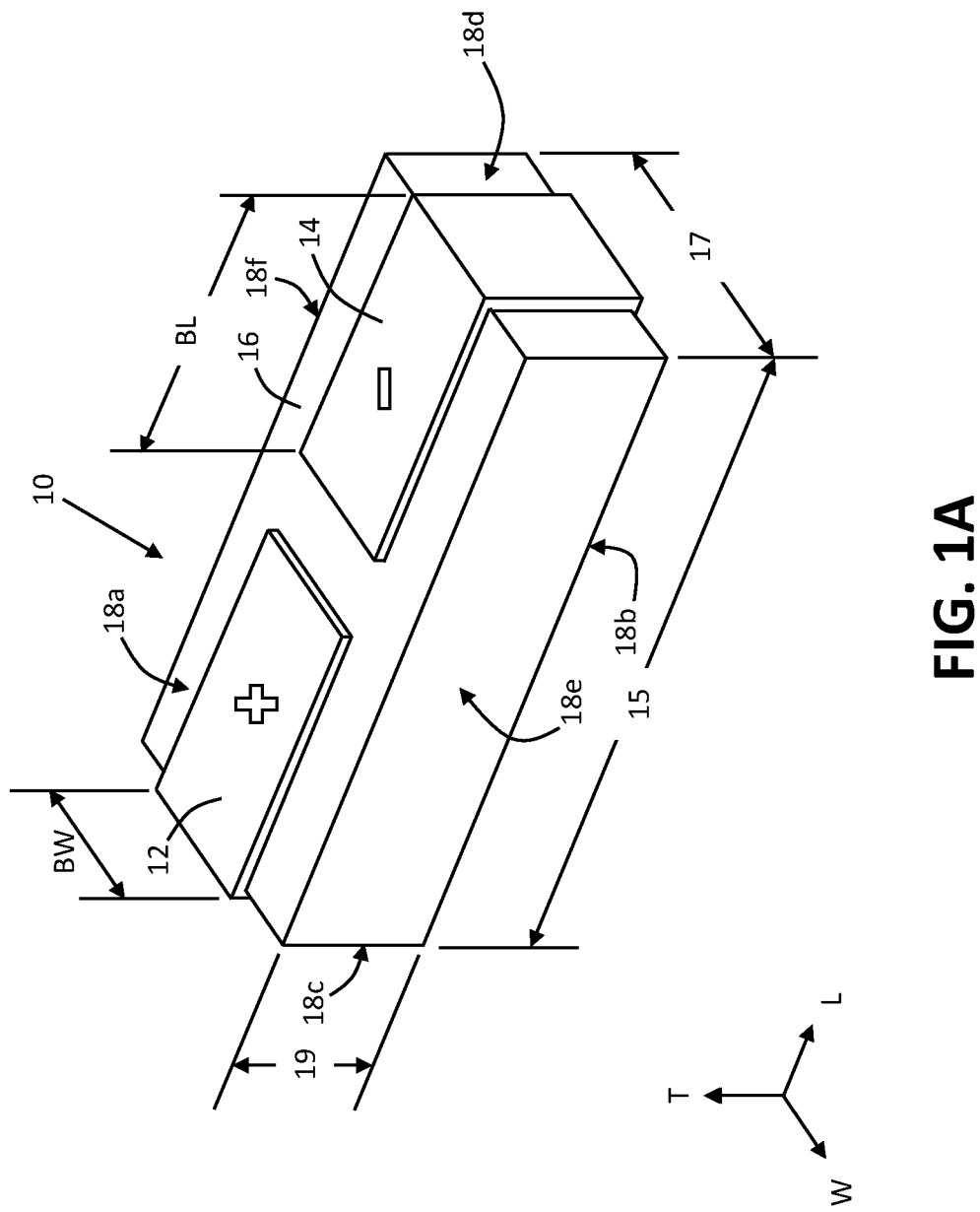
FIG. 1A illustrates a generally top and sides external perspective view of one embodiment of a capacitor including two external terminals in accordance with the present invention.

It is to be understood by one of ordinary skill in the art that the present discussion is a description of exemplary embodiments only and is not intended as limiting the broader aspects of the present invention.

Generally speaking, the present invention is directed to a multilayer capacitor. The multilayer capacitor (or simply, capacitor) contains alternating dielectric layers and internal electrode layers. Each internal electrode layer includes a first electrode and a second counter electrode that is co-planar with the first electrode. The first electrode has a main body with at least one lead tab extending from a top edge of the main body and at least one lead tab extending from a bottom edge of the main body. The capacitor also includes two or more external terminals, with the lead tabs and second electrodes assisting in the formation of the external terminals.

The particular arrangement of the elements of the capacitor can provide several advantages. For instance, the present inventors have discovered that by utilizing such configurations for the capacitor and electrode layers therein as well as by utilizing specific materials for the electrodes and dielectrics as described herein, the multilayer capacitor may have a low equivalent series resistance, in particular across a broad range of frequencies. In particular, such low equivalent series resistance may be realized and beneficial at relatively high frequencies.

In this regard, the capacitor may have an equivalent series resistance of 100 Ohms or less, such as 75 Ohms or less, such as 50 Ohms or less, such as 40 Ohms or less, such as 30 Ohms or less, such as 25 Ohms or less, such as 20 Ohms or less, such as 15 Ohms or less, such as 10 Ohms or less, such as 8 Ohms or less, such as 5 Ohms or less, such as 3 Ohms or less, such as 2 Ohms or less, such as 1 Ohm or less. The equivalent series resistance may be 0.01 Ohms or more, such as 0.1 Ohms or more, such as 0.2 Ohms or more, such as 0.3 Ohms or more, such as 0.5 Ohms or more, such as 0.8 Ohms or more, such as 1 Ohm or more, such as 2 Ohms or more, such as 3 Ohms or more, such as 5 Ohms or more, such as 8 Ohms or more, such as 10 Ohms or more. Such equivalent series resistance may be realized when measured across a frequency range of from 1 GHz to 10 GHz, such as from 2 GHz to 10 GHz, such as from 3 GHz to 10 GHz, such as from 4 GHz to 9 GHz. The equivalent series resistance may be measured using general techniques as known in the art and as described herein.

In some embodiments the capacitor may exhibit the aforementioned equivalent series resistance at about a single frequency. For instance, in one embodiment, the capacitor may exhibit the aforementioned equivalent series resistance at about 2 GHz, such as at about 3 GHz, such as at about 4 GHz, such as at about 5 GHz, such as at about 6 GHz, such as at about 7 GHz, such as at about 8 GHz, such as at about 9 GHz, such as at about 10 GHz. In one embodiment, the capacitor may exhibit the aforementioned equivalent series resistance at more than one of the aforementioned frequencies.

In addition to exhibiting a relatively low equivalent series resistance due to the selective control over the particular configuration of the electrodes and capacitor as well as the materials for the electrodes and dielectrics, the resulting capacitor may also exhibit a low equivalent series inductance. For instance, employing the capacitor of the present invention may result in an inductance on the order of picohenries or even femtohenries in comparison to capacitors of the prior art which exhibit inductance of greater magnitudes. In general, the inductance may be less than 1 nanohenry. In particular, the inductance may be 900 picohenries or less, such as 750 picohenries or less, such as 500 picohenries or less, such as 400 picohenries or less, such as 250 picohenries or less, such as 100 picohenries or less, such as 50 picohenries or less, such as 25 picohenries or less, such as 15 picohenries or less, such as 10 picohenries or less. The inductance may be 1 femtohenry or more, such as 25 femtohenries or more, such as 50 femtohenries or more, such as 100 femtohenries or more, such as 250 femtohenries or more, such as 500 femtohenries or more, such as 750 femtohenries or more. Minimizing such inductance can contribute to good performance, in particular good decoupling performance, especially under high-speed transient conditions. The low equivalent series inductance values may also be characterized by a low impedance value, which is a reflection of parasitic inductance.

As indicated above, the present invention includes a multilayer capacitor that includes a top surface and a bottom surface opposite the top surface. The capacitor also includes at least one side surface, in particular at least two side surfaces, that extend between the top surface and the bottom surface. The capacitor may include at least one end surface, in particular at least two end surfaces, that extend between the top surface and the bottom surface. In general, the side surfaces extend in the longitudinal or length (L) direction and have a generally longer dimension than the end surfaces which extend in the lateral or width (W) direction and have a generally shorter dimension. In one embodiment, the capacitor includes at least six total surfaces (e.g., one top, one bottom, two sides, and two ends). For instance, the capacitor may have a parallelepiped shape, such as a rectangular parallelepiped shape.

In addition, the capacitor may have a desired height. For instance, the height may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 1,000 microns or more, such as 2,000 microns or more. The height may be 5,000 microns or less, such as 4,000 microns or less, such as 2,500 microns or less, such as 2,000 microns or less, such as 1,000 microns or less, such as 750 microns or less, such as 600 microns or less, such as 500 microns or less, such as 450 microns or less. When surrounded by a ball grid array, the height of the capacitor may be within 10%, such as within 7%, such as within 5%, such as within 3%, such as within 2%, such as within 1% the height (or diameter) of the balls of the ball grid array. For instance, such height may be the original height prior to any reflow.

The capacitor may have a desired length. For instance, the length may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 1,000 microns or more, such as 1,500 microns or more, such as 2,000 microns or more, such as 2,500 microns or more, such as 3,000 microns or more, such as 3,500 microns or more, such as 4,000 microns or more. The length may be 10,000 microns or less, such as 8,000 microns or less, such as 6,000 microns or less, such as 5,000 microns or less, such as 4,000 microns or less, such as 3,000 microns or less, such as 2,500 microns or less, such as 2,000 microns or less, such as 1,000 microns or less, such as 750 microns or less, such as 600 microns or less, such as 500 microns or less, such as 450 microns or less.

The capacitor may also have a desired width. For instance, the width may be 10 microns or more, such as 25 microns or more, such as 50 microns or more, such as 100 microns or more, such as 200 microns or more, such as 250 microns or more, such as 300 microns or more, such as 350 microns or more, such as 400 microns or more, such as 450 microns or more, such as 500 microns or more, such as 750 microns or more, such as 1,000 microns or more, such as 1,500 microns or more, such as 2,000 microns or more, such as 2,500 microns or more, such as 3,000 microns or more. The width may be 5,000 microns or less, such as 4,000 microns or less, such as 3,000 microns or less, such as 2,500 microns or less, such as 2,000 microns or less, such as 1,500 microns or less, such as 1,000 microns or less, such as 750 microns or less, such as 600 microns or less, such as 500 microns or less, such as 450 microns or less.

In general, the multilayer capacitor contains a set of alternating dielectric layers and internal electrode layers. The capacitor also includes external terminals electrically connected to the internal electrode layers wherein the external terminals are formed on a top surface of the capacitor and a bottom surface of the capacitor opposing the top surface of the capacitor and at least two opposing end surfaces.

In general, the capacitor includes at least one set of alternating dielectric layers and internal electrode layers. The capacitor may also contain a second set of alternating dielectric layers and internal electrode layers. In this regard, the capacitor may include at least two, such as at least three, such as at least four sets of alternating dielectric layers and internal electrode layers. However, it should be understood that the present invention may include any number of sets of alternating dielectric layers and internal electrode layers and is not necessarily limited. In addition, the respective sets of alternating dielectric layers and internal electrode layers may be separated from an adjacent set by a certain distance. For instance, that distance is greater than the thickness of an individual dielectric layer in the set. In particular, the distance may be at least two, such as at least 3, such as at least 5, such as at least 10 times the thickness of a dielectric layer in the set.

The set(s) of alternating dielectric layers and internal electrode layers may form at least part of the body of the capacitor. By arranging the dielectric layers and the internal electrode layers in a stacked or laminated configuration, the capacitor may be referred to as a multilayer capacitor and in particular a multilayer ceramic capacitor, for instance when the dielectric layers comprise a ceramic.

The set of alternating dielectric layers and internal electrode layers comprises dielectric layers alternately arranged with internal electrode layers. In particular, the internal electrode layers include first internal electrode layers and second internal electrode layers interleaved in an opposed and spaced apart relation with a dielectric layer located between each internal electrode layer.

In general, the thickness of the dielectric layers and internal electrode layers is not limited and can be any thickness as desired depending on the performance characteristics. For instance, the thickness of the internal electrode layers can be, but is not limited to, being about 500 nm or greater, such as about 1 μm or greater, such as about 2 μm or greater to about 10 μm or less, such as about 5 μm or less, such as about 4 μm or less, such as about 3 μm or less, such as about 2 μm or less. For instance, the internal electrode layers may have a thickness of from about 1 μm to about 2 μm.

In addition, the present invention is not necessarily limited by the number of internal electrode layers per set of alternating dielectric layers and internal electrode layers or in the entire capacitor. For instance, each set may include 10 or more, such as 25 or more, such as 50 or more, such as 100 or more, such as 200 or more, such as 300 or more, such as 500 or more, such as 600 or more, such as 750 or more, such as 1,000 or more internal electrode layers. Each set may have 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers. Also, the entire capacitor may include the aforementioned number of electrode layers.

Each internal electrode layer of the plurality of internal electrode layers, which alternate with the plurality of dielectric layers, includes a first electrode and a second (counter) electrode. For instance, each first internal electrode layer includes a first electrode and a second electrode, and each second internal electrode layer includes a first electrode and a second electrode. The second internal electrode layers may have a similar, mirrored structure as the first internal electrodes.

The first electrode and the second electrode of an internal electrode layer are co-planar, i.e., in substantially the same plane, longitudinally and laterally. The first electrode includes a central portion or main body that extends away from an external terminal and one end of the first electrode toward the other external terminal. Such portion may extend directly from the external terminal. Alternatively, such portion may extend from a base portion of the first electrode, which along with the central portion or main body also extends from the external terminal. In general, the base portion of the first electrode extends along a side edge of the first electrode adjacent the external terminal. In addition, the main bodies of the first electrodes of adjacent electrode layers at last partially overlap in a horizontal direction.

The central portion or main body of the first electrode may be of a certain length in the longitudinal direction, e.g., the length is the distance of the main body of the first electrode from the side edge adjacent and connecting to the external terminal to the opposing side edge of the central portion or main body. For instance, the internal electrode layer, including the first electrode and the second electrode, extends between a first external terminal and a second external terminal. The main body of the first electrode may extend 40% or more, such as 50% or more, such as 55% or more, such as 60% or more, such as 65% or more, such as 70% or more a length of the capacitor body in the longitudinal or length direction between the opposing end surfaces. (i.e., the length between the external terminals formed along the end surfaces). The main body of the first electrode may extend less than 100%, such as 90% or less, such as 85% or less, such as 80% or less, such as 75% or less, such as 70% or less, such as 65% or less the length of the capacitor body.

The second (counter) electrode in each internal electrode layer may extend 5% or more, such as 10% or more, such as 15% or more, such as 18% or more, such as 20% or more, such as 22% or more the distance between the first external terminal and the second external terminal. The second electrode may extend 50% or less, such as 40% or less, such as 35% or less, such as 30% or less, such as 25% or less the distance between the first external terminal and the second external terminal.

In addition, a gap may be present between the central portion or main body of the first electrode and the second electrode within an internal electrode layer. Such gap may be 2% or more, such as 5% or more, such as 7% or more, such as 9% or more, such as 10% or more, such as 12% or more the distance between the first external terminal and the second external terminal. Such gap may be 40% or less, such as 30% or less, such as 25% or less, such as 20% or less, such as 15% or less, such as 13% or less, such as 11% or less the distance between the first external terminal and the second external terminal.

The gap may be 5% or more, such as 7% or more, such as 10% or more, such as 13% or more, such as 15% or more, such as 18% or more, such as 20% or more the length of the central portion of the first electrode. The gap may be 40% or less, such as 35% or less, such as 30% or less, such as 25% or less, such as 22% or less, such as 20% or less, such as 18% or less, such as 15% or less the length of the central portion of the first electrode.

Further, the main body of the first electrode of each internal electrode layer has a top edge and a bottom edge opposite the top edge. The main body also has two side edges that extend between the top edge and the bottom edge. The side edges, top edge, and bottom edge define the main body of the first electrode. In general, the main body may have a rectangular configuration or shape.

In general, the top edge and the bottom edge of the main body may have the same dimension (e.g., length or longitudinal direction L). The side edges of the main body may have the same dimension (e.g., height direction T). In general, the side edges may have a dimension (e.g., height direction T) that is shorter than a dimension (e.g., length or longitudinal direction L) of the top edge and/or bottom edge. In this regard, the height of a side edge of the main body as it extends between the top and bottom surfaces of the capacitor may be less than the length of the top edge and/or bottom edge of the main body as it extends between end surfaces of the capacitor. In other words, the main body may have a top edge and/or a bottom edge of greater dimension than the side edges of a lesser dimension. In this regard, the "short" sides of the internal electrode layers may register with the height direction of the capacitor.

The internal electrode layers have lead tabs extending from the main body of the first electrode. The lead tabs extend from a top edge and a bottom edge. In other words, the internal electrode layers may have lead tabs extending from the "long" sides or edges of the layers. The lead tabs may extend to an edge of a dielectric layer and/or a surface of the capacitor. For instance, when in a stacked configuration, a leading edge of a respective lead tab may extend to an edge of a dielectric layer. Such leading edge may be used to form the external terminals. In addition, the top edge and the bottom edge of a first electrode of an internal electrode layer may have at least one lead tab, such as at least two lead tabs, such as at least three lead tabs, such as at least four lead tabs extending therefrom.

Each top edge and bottom edge of the main body of the first electrodes may have an equal number of lead tabs extending therefrom. For instance, each top edge and bottom edge may have at least one lead tab extending therefrom. In another embodiment, each top edge and bottom edge may have at least two lead tabs extending therefrom. However, it should be understood that the present invention may include any number of lead tabs extending from the internal electrode layers and is not necessarily limited.

In one embodiment, at least one lead tab extends from a top edge and at least one lead tab extends from a bottom edge of the main body of the first electrode of an internal electrode layer, and an edge of at least one lead tab aligns with a side edge of the main body. For instance, at least one lateral edge (i.e., edge registering in a height direction) of the at least one lead tab extending from the top edge or of the at least one lead tab extending from the bottom edge may be substantially aligned with a respective side edge of the main body of the first electrode. In this regard, at least one lead tab may not be offset from the side edge of the main body.

In addition, when more than one lead tab may be present along an edge, the lead tab may extend from an inner portion of a top edge and a bottom edge of the main body of the first electrode. In this regard, the lead tab may not extend immediately from a side edge of the main body. In other words, the lead tab may be offset from a side edge of the main body. The offset may be such that it is offset and positioned between the side edges of the main body, in particular at a position that is at least 50% of the length of the main body (e.g., past the center of the main body).

The lead tabs extending from a top edge of a respective first electrode and a bottom edge of the same first electrode of an internal electrode layer may be offset the same distance from a side edge. In this regard, at least one lateral edge (i.e., edge registering in a height direction) of the lead tabs may be substantially aligned. In one embodiment, both lateral edges of the respective lead tabs may be substantially aligned.

Similarly, the length (i.e., extending in the longitudinal or length direction from an end surface to another end surface) of a lead tab extending from the top edge may be the same as the length of a corresponding lead tab extending from the bottom edge.

The length of the lead tab may be 0.3 mm or more, such as 0.4 mm or more, such as 0.5 mm or more, such as 0.6 mm or more, such as 0.7 mm or more. The length of the lead tab may be 1.1 or less, such as 0.9 or less, such as 0.8 or less, such as 0.7 or less, such as 0.6 or less, such as 0.5 or less. When more than one lead tab is present along an edge, each lead tab may have the same length.

In another embodiment, each lead tab may have a different length. For instance, the lead tab substantially aligned with the side edge of the main body of the first electrode may have a length greater than the lead tab offset from the side edges of the main body. In this regard, the ratio of the length of the lead tab aligned with the side edge of the main body to the length of the lead tab offset from the side edges of the main body may be 0.3 or more, such as 0.5 or more, such as 0.7 or more, such as 0.9 or more, such as 1 or more, such as 1.1 or more, such as 1.2 or more, such as 1.3 or more, such as 1.4 or more, such as 1.5 or more. The ratio may be 5 or less, such as 4 or less, such as 3 or less, such as 2 or less, such as 1.8 or less, such as 1.7 or less, such as 1.6 or less, such as 1.5 or less, such as 1.4 or less.

By substantially aligned, it is meant that the offset from a side edge to one lateral edge of a first lead tab and/or second lead tab on a top edge is within +/−10%, such as within +/−5%, such as within +/−4%, such as within +/−3%, such as within +/−2%, such as within +/−1%, such as within +/−0.5% of the offset from a side edge to a corresponding lateral edge of a first lead tab and/or second lead tab on a bottom edge.

The distance between adjacent exposed lead tabs of the internal electrode layers in a given column may be specifically designed to ensure guided formation of terminations. Such distance between exposed lead tabs of the internal electrode layers in a given column may be about 10 microns or less, such as about 8 microns or less, such as about 5 microns or less, such as about 4 microns or less, such as about 2 microns or less, such as about 1.5 microns or less, such as about 1 micron or less. The distance may be about 0.25 microns or more, such as about 0.5 microns or more, such as about 1 micron or more, such as about 1.5 microns or more, such as about 2 microns or more, such as about 3 microns or more. However, it should be understood that such distance may not necessarily be limited.

Additionally, the distance between adjacent columnar stacks of electrode tabs may be, while not limited, greater by at least a factor of two than the distance between adjacent lead tabs in a given column to ensure that distinct terminations do not run together. In some embodiments, the distance between adjacent columnar stacks of exposed metallization is about four times the distance between adjacent exposed electrode tabs in a particular stack. However, such distance may vary depending on the desired capacitance performance and circuit board configuration.

The distance may be 0.1 mm or more, such as 0.2 mm or more, such as 0.3 mm or more, such as 0.4 mm or more, such as 0.5 mm or more, such as 0.6 mm or more. The distance may be 1.5 mm or less, such as 1.3 mm or less, such as 1 mm or less, such as 0.9 mm or less, such as 0.7 mm or less, such as 0.6 mm or less, such as 0.5 mm or less, such as 0.4 mm or less. Such distance may be determined based on the centerpoint of each lead tab in one embodiment. In another embodiment, such distance may be based on the distance between adjacent lateral edges of the lead tabs. In addition, such distance may correspond to the separation distance of the ball on a ball grid array.

A lead tab of a first internal electrode layer and a lead tab of a second internal electrode layer within a set of alternating dielectric layers and internal electrode layers are offset from each other in a longitudinal direction. That is, the lead tabs of respective internal electrode layers may be symmetrically offset a certain distance from a centerline (e.g., longitudinal centerline or about a vertical line) of the internal electrode layers and/or dielectric layer. That is, the lead tabs of respective internal electrode layers may be symmetrically offset about a vertical line of the internal electrode layers and/or dielectric layer. Regardless, a gap region is formed between the lead tabs of respective internal electrode layers.

In addition, the internal electrode layers, regardless of the number of lead tabs extending therefrom, may be symmetrical in a given direction. For instance, the lead tabs may be symmetrical about a horizontal line (i.e., a line extending from the center of one side edge to the center of the other side edge of the first electrode of the internal electrode layer) through the center of the main body of the first electrode.

Further, as indicated herein, each first electrode of an internal electrode layer includes at least two side edges. When stacked to form the body of the capacitor, such side edges of the first electrodes of alternating internal electrode layers may not be substantially aligned with one another. For instance, the side edges may be offset from one another.

As indicated herein, the capacitor includes a set of alternating dielectric layers and internal electrode layers. If the capacitor includes a second set of alternating dielectric layers and internal electrode layers, in one embodiment, the distance between the first internal electrode layer of one set and the last internal electrode layer of another set may be greater than the distance between adjacent internal electrode layers within a given set. For instance, the distance between the first internal electrode layer of a first set and the last internal electrode layer of a second set may be greater than the distance between the first internal electrode layer and the second internal electrode layer of the first set.

The capacitor of the present invention also includes external terminals on the top surface and the bottom surface. The capacitor also includes external terminals on opposing end surfaces. In one particular embodiment, the external terminals may not be present on a side surface of the capacitor. For example, the external terminals present on the top surface and bottom surface extend to only the end surfaces, and the respective top and bottom external terminals, including the wrap around terminations, do not contact one another. In this regard, each external terminal wraps around and contacts three surfaces (e.g., the top surface, one end surface, and the bottom surface and the top surface, the other end surface, and the bottom surface). Such wrap around termination can be provided by employing various electrode configurations, including anchor or dummy electrodes as described herein.

Additionally, the capacitor includes a first external terminal and a second external terminal. In general, the first electrodes of the first internal electrode layers and the second electrodes of the second internal electrode layers are electrically connected to the first external terminal. Meanwhile, the first electrodes of the second internal electrode layers and the second electrodes of the first internal electrode layers are electrically connected to the second external terminal. As described herein, the second electrodes of the internal electrode layers may be anchor or dummy electrodes (also referred to as anchor or dummy tabs) configured to assist in the formation of the first external terminal and the second external terminal.

The external terminals include at least one first polarity terminal and at least one second and opposite polarity terminal. The capacitor may include at least one, such as at least two, such as at least four, such as at least six, such as at least eight first polarity terminals and/or second and opposite polarity terminals on a top surface of the capacitor. Additionally, the capacitor may include the aforementioned amounts of terminals on a bottom surface of the capacitor.

The capacitor may include an equal number of first polarity terminals and/or second polarity terminals on the top surface of the capacitor and the bottom surface of the capacitor. The number of first polarity terminals may equal the number of second and opposite polarity terminals on a top surface of the capacitor. The number of first polarity terminals may equal the number of second and opposite polarity terminals on a bottom surface of the capacitor. The total number of terminals present on a top surface of the capacitor may equal to the total number of terminals present on a bottom surface of the capacitor. The total number of first polarity terminals present on a top surface and a bottom surface of the capacitor may equal the total number of second and opposite polarity terminals present on a top surface and a bottom surface of the capacitor.

In general, the like polarity terminals on the bottom surface of the capacitor that correspond to a particular set of alternating dielectric layers and internal electrode layers are electrically connected to the like polarity terminals on the top surface of the capacitor. The like polarity terminals located on a top surface and a bottom surface of a capacitor may not be interdigitated. In this regard, corresponding like polarity terminals on a top and a bottom surface may not be offset by a terminal position but may instead be positioned directly above or below another like polarity terminal on the opposite top or bottom surface. In other words, corresponding like polarity terminals that correspond to a particular set of alternating dielectric layers and internal electrode layers, and in particular corresponding lead tabs of such set, may be substantially aligned. By substantially aligned, it is meant that the offset from a side edge of one lateral edge of a polarity terminal on a top surface is within +/−10%, such as within +/−5%, such as within +/−4%, such as within +/−3%, such as within +/−2%, such as within +/−1%, such as within +/−0.5% of the offset from a side edge of a corresponding polarity terminal on a bottom surface.

In general, the pitch (i.e., nominal distance between the centers also referred to as center-to-center spacing) of the external terminals may be dictated by the particular circuit board configuration. The pitch between external terminals in one direction (i.e., x or y direction) may be the same as the pitch between adjacent external terminals in the other direction (i.e., y or x direction, respectively). That is, the pitch between any two adjacent external terminals may be substantially the same as the pitch between any other two adjacent external terminals.

The pitch may be about 0.1 mm or greater, such as about 0.2 mm or greater, such as about 0.3 mm or greater, such as 0.4 mm or greater, such as about 0.5 mm or greater, such as about 0.6 mm or greater, such as about 0.7 mm or greater, such as about 0.8 mm or greater, such as about 0.9 mm or greater, such as about 1.0 m or greater. The pitch may be about 2.0 mm or less, such as about 1.5 mm or less, such as about 1.4 mm or less, such as about 1.3 mm or less, such as about 1.2 mm or less, such as about 1.1 mm or less, such as about 1.0 mm or less. For instance, the pitch may be about 0.2 mm, about 0.4 mm, about 0.6 mm, about 0.8 mm, about 1.0 mm, about 1.2 mm, etc. In particular, the pitch may be 0.6 mm, 0.8 mm, or 1.0 mm. In one embodiment, the pitch may be about 0.6 mm, such as 0.6 mm+/−10%, such as +/−5%, such as +/−2%, such as +/−1%. In another embodiment, the pitch may be about 0.8 mm, such as 0.8 mm +/−10%, such as +/−5%, such as +/−2%, such as +/−1%. In a further embodiment, the pitch may be about 1 mm, such as 1 mm+/−10%, such as +/−5%, such as +/−2%, such as +/−1%.

As indicated above, the extension of a leading edge of a lead tab can assist in the formation of the external terminals. In this regard, the pitch between a lead tab on a first electrode of a first internal electrode layer and a lead tab on a first electrode of a second internal electrode layer may be the same as mentioned above. That is, the pitch between a lead tab on a first electrode of a first internal electrode layer and a lead tab on a second electrode of a second internal electrode layer may be substantially the same as the pitch between the corresponding external terminals for which the lead tabs are utilized in forming.

In addition, the external terminals may be positioned similar to the configuration of a ball-grid array. For instance, the external terminals may be provided to make contacts as typically employed by a ball-grid array, in particular a surrounding ball-grid array. In this regard, the pitch of the external terminals may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array.

In addition, like a ball-grid array, the external terminals may be provided in rows and columns. That is, the external terminals may be provided such that they exist in at least one row and at least two columns. For instance, the external terminals may be presented in at least one row, such as at least two rows, such as at least three rows, such as at least four rows. The number of rows can be dictated by the number of different sets of alternating dielectric layers and internal electrode layers. In addition, the external terminals may be presented in at least two columns, such as at least three columns, such as at least four columns. The number of columns can be dictated by the number of different columnar tabs of the internal electrodes.

Further, the length of an external terminal extending in the longitudinal or length direction along the top surface may be the same as the length of a corresponding external terminal extending along the bottom surface. The length of an external terminal may be measured from one terminal end surface to another terminal end surface, which are opposed to one another in the longitudinal direction.

The length of the external terminal may be 0.3 mm or more, such as 0.4 mm or more, such as 0.5 mm or more, such as 0.6 mm or more, such as 0.7 mm or more. The length of the external terminal may be 1.1 or less, such as 0.9 or less, such as 0.8 or less, such as 0.7 or less, such as 0.6 or less, such as 0.5 or less. When more than one external terminal is present along a surface, each external terminal may have the same length. Further, the length of the external terminal may be less than the length of the capacitor, such as 50% or less, such as 40% or less, such as 30% or less, such as 25% or less, such as 20% or less, such as 15% or less the length of the capacitor.

In another embodiment, each external terminal may have a different length. For instance, the external terminal adjacent an end surface may have a length greater than the external terminal offset from the end surface. In this regard, the ratio of the length of the external terminal adjacent an end surface to the length of the external terminal offset from the end surface may be 0.3 or more, such as 0.5 or more, such as 0.7 or more, such as 0.9 or more, such as 1 or more, such as 1.1 or more, such as 1.2 or more, such as 1.3 or more, such as 1.4 or more, such as 1.5 or more. The ratio may be 5 or less, such as 4 or less, such as 3 or less, such as 2 or less, such as 1.8 or less, such as 1.7 or less, such as 1.6 or less, such as 1.5 or less, such as 1.4 or less.

Further, the width of an external terminal extending in the lateral or width direction may be same on the top surface and the bottom surface. The width of an external terminal may be measured from one terminal side surface to another terminal side surface, which are opposed to one another in the lateral direction.

The width of an external terminal may be 0.3 mm or more, such as 0.4 mm or more, such as 0.5 mm or more, such as 0.6 mm or more, such as 0.7 mm or more. The width of the external terminal may be 1.1 or less, such as 0.9 or less, such as 0.8 or less, such as 0.7 or less, such as 0.6 or less, such as 0.5 or less. When more than one external terminal is present along a surface, each external terminal may have the same width. Further, the width of the external terminal may be less than the width of the capacitor.

As described herein, the formation of the external terminals or external terminations is generally guided by the position of the exposed edges of the internal electrode layers. Such phenomena may be referred to as "self-determining" because the formation of the external plated terminals is determined by the configuration of the exposed conductive metal of the electrode layers at the selected peripheral locations on the capacitor. In some embodiments, the capacitor may include "dummy tabs" to provide exposed conductive metal along portions of the body of the capacitor that does not include other electrodes (e.g., active or shield electrodes). In some embodiments, one or more "dummy tabs," "dummy electrodes," anchor tabs, and/or anchor electrodes may, e.g., be added features for a nucleate function occurring such as during an FCT (fine copper termination, electroless plating) process. Such dummy or anchor tabs or electrodes may be positioned internally or externally relative to the body of the component to nucleate metallized plating material to form external plated terminals in an FCT process. For instance, a first plurality of dummy tabs may be connected with the first external terminal, and a second plurality of dummy tabs may be connected with the second external terminal. In general, the second electrodes of the internal electrode layers are dummy or anchor tabs or electrodes that assist in the formation of the first external terminal and the second external terminal.

The second electrodes (i.e., the dummy or anchor tabs or electrodes) may have any configuration known in the art. For instance, in some embodiments, the second electrodes may have a rectangular configuration or shape, while in other embodiments, the second electrodes may have a C-shaped configuration or an L-shaped configuration. For example, the second electrodes may have a base portion and at least one, such as two, electrode arms extending from the base portion, in particular from the lateral ends of the base portion. Such electrode arms may extend in the longitudinal direction away from an end of the capacitor body. Such electrode arms of the second electrodes may also be longitudinally aligned. It will be appreciated, however, that the second electrodes may have any shape as generally known in the art.

The capacitor of the present invention can be further described according to the embodiments as illustrated in FIGS. 1A-1E and 2A-2C.

FIG. 1A illustrates a capacitor 10 in a 1 by 2 configuration. That is, the capacitor 10 includes two external terminals arranged in a linear fashion in a single dimension on a top surface and a bottom surface of the capacitor. In the depicted embodiment, the capacitor 10 includes external terminals arranged in a linear fashion or a single row along a longitudinal direction L, which may be referred to as a linear terminal arrangement.

Figure 1C:
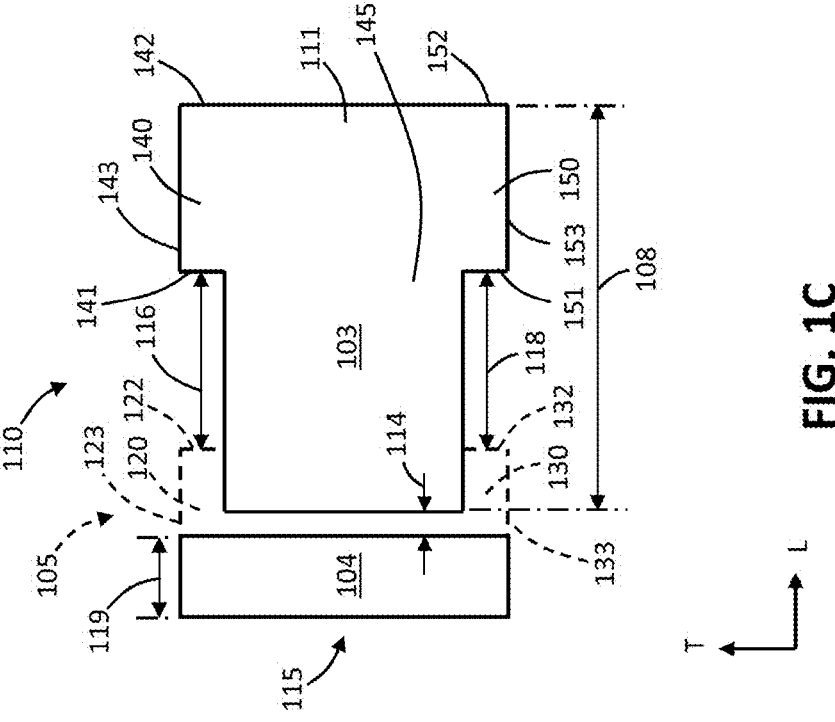
FIG. 1C illustrates a side perspective view of the internal electrode layers of the capacitor of FIG. 1A.
Figure 1B:
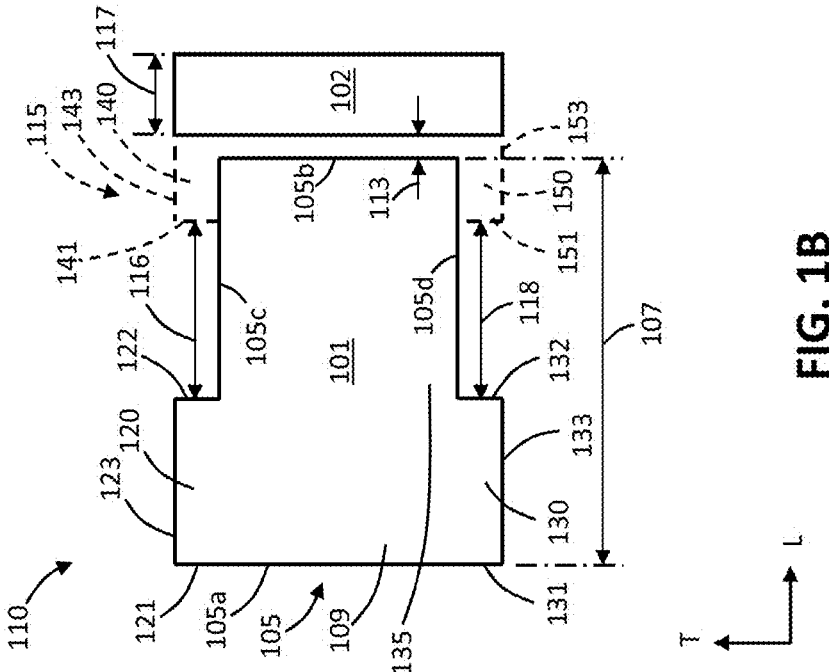
FIG. 1B illustrates a side perspective view of the internal electrode layers of the capacitor of FIG. 1A.

In addition, the capacitor includes terminals along an end surface such that a respective terminal wraps around from the top surface to the bottom surface along the adjacent end surface. In this regard, the capacitor 10 includes a body 16 having external terminals 12, 14, including a first external terminal 12 and a second external terminal 14. The first external terminal 12 is disposed on the top surface 18a, an end surface 18c, and the bottom surface 18b and is electrically connected to first internal electrode layers 105 (FIGS. 1B-1E). The first external terminal 14 is disposed on the top surface 18a, an end surface 18d, and the bottom surface 18b and is electrically connected to second internal electrode layers 115 (FIGS. 1B, 1C).

Additionally, the capacitor 10 of FIG. 1A includes at least one first polarity terminal 12 and at least one second and opposite polarity terminal 14 on the top surface 18a. Although not shown, the bottom surface 18b includes at least a first polarity terminal 12 and a second and opposite terminal 14.

The body 16 of the capacitor 10 has a length 15 extending in a longitudinal or length direction L. The length 15 may be measured from one end surface 18c to the opposing end surface 18d. Further, the body 16 of the capacitor 10 has a width 17 extending in a lateral or width direction W. The width 17 may be measured from one side surface 18e to the opposing side surface 18e. Moreover, the body 16 of the capacitor 10 has a height 19 extending in the vertical or height direction T. The height 19 may be measured from the top surface 18a to the opposing bottom surface 18b.

As shown in FIG. 1A, the external terminals 12, 14 have a terminal width BW extending in the lateral or width direction W. The external terminals 12, 14 also have a terminal length BL along the top surface 18a, the terminal length BL extending in the longitudinal or length direction L. It will be appreciated that one or both terminals 12, 14 also may have a terminal length BL along the bottom surface 18b, which may be the same as or different than the terminal length BL along the top surface 18a.

Referring to FIGS. 1A-1C, the capacitor 10 includes external terminals 12, 14 and a set of alternating dielectric layers and internal electrode layers 110. Referring particularly to FIGS. 1B and 1C, the set of alternating dielectric layers and internal electrode layers 110 includes first and second internal electrode layers 105, 115 and dielectric layers (not shown) in an alternate arrangement.

In general, each of the first internal electrode layers 105 includes a first electrode 101 and a second electrode 102, and each of the second internal electrode layers 115 includes a first electrode 103 and a second electrode 104. Further, the internal electrode layers 105, 115 include at least one lead tab 120, 130, 140, 150 extending along the vertical or height direction T from a top edge and a bottom edge of a main body of the first electrodes 101, 103. As such, the lead tabs 120, 130, 140, 150 extend from the main body perpendicular to a length 107, 108 of the first electrode 101, 103 and the length 15 of the capacitor body 16, where each of the first electrode length 107, 108 and the capacitor body length 15 extend along the longitudinal direction L.

In general, the lead tabs 120, 130, 140, 150 of the internal electrode layers 105, 115 extend to the top surface and the bottom surface of the capacitor and assist in forming the external terminals 12, 14. In this regard, the lead tabs 120, 130, 140, 150 may be exposed on the top surface 18a and the bottom surface 18b of the capacitor and allow for connection between the main body of the first electrodes 101, 103 and the external terminals 12, 14.

For instance, lead tabs 120, 130, 140, 150 may contain leading edges 123, 133, 143, 153 that extend to an edge of a dielectric layer and allow for formation of the external terminals. The leading edges 123, 133, 143, 153 each extend along the longitudinal direction L and are spaced apart from the main body along the vertical or height direction T. The first external terminal 12 can be electrically connected to the first electrode 101 of the first internal electrode layers 105 along the leading edge 123 of the lead tab 120 and the leading edge 133 of the lead tab 130. Similarly, the second external terminal 14 can be electrically connected to the first electrode 103 of the second internal electrode layers 115 along the leading edge 143 of the lead tab 140 and the leading edge 153 of the lead tab 150.

As illustrated in FIGS. 1B and 1C, a first internal electrode layer 105 includes one lead tab 120, 130 extending from a main body 135 along a top edge 105c and a bottom edge 105d. A second internal electrode layer 115 includes one lead tab 140, 150 extending from a main body 145 along a top edge and a bottom edge.

The main body 135, 145 of the first electrode 101, 103 of each internal electrode layer 105, 115 has a top edge 105c and a bottom edge 105d opposite the top edge 105c along the vertical or height direction T. Each of the top edge 105c and the bottom edge 105d extends along the longitudinal direction L. The main body 135, 145 also has two side edges 105a, 105b that extend along the vertical or height direction T between the top edge 105c and the bottom edge 105d. The side edges 105a, 105b, top edge 105c, and bottom edge 105d define the main body 135, 145 of the first electrode 101, 103. In general, the main body 135, 145 may have a rectangular configuration or shape.

The lead tabs 120, 130 on the top edge and the bottom edge of main body 135 may be aligned in the vertical or height direction T. For example, a lateral edge 121, 122 of a first lead tab 120 along a top edge 105c may be aligned with a lateral edge 131, 132 of a first lead tab 130 along a bottom edge 105d opposite the top edge 105c. In addition, such lateral edges 121, 131 may be aligned with a side edge 105a of the main body 135.

However, it should be understood that both lateral edges 121, 122 of the first lead tab 120 along a top edge 105c may be aligned with the lateral edges 131, 132 of a first lead tab 130 along a bottom edge 105d opposite the top edge 105c. In other words, the lateral edges 122, 132 may be aligned and both lateral edges 122, 132 may be offset from the side edges 105a, 105b the same distance along the bottom edge 105d and the top edge 105c.

Similarly, the lead tabs 140, 150 on the top edge and the bottom edge of main body 145 may be aligned in the vertical or height direction T. That is, a lateral edge 141, 142 of a first lead tab 140 along a top edge may be aligned with a lateral edge 151, 152 of a first lead tab 150 along a bottom edge opposite the top edge. In one embodiment, both lateral edges 141, 142 of the first lead tab 140 along a top edge may be aligned with the lateral edges 151, 152 of a first lead tab 150 along a bottom edge opposite the top edge. The relationship between lateral edges of a first lead tab on a top edge and a first lead tab on a bottom edge as mentioned with respect to internal electrode layer 105 may also apply to internal electrode layer 115.

With such arrangement, a tab gap 116 may be formed between lead tab 120 of the first internal electrode layer 105 and lead tab 140 of the second internal electrode layer 115. Similarly, a tab gap 118 may be formed between lead tab 130 of the first internal electrode layer 105 and lead tab 150 of the second internal electrode layer 115. The size of each respective tab gap 116, 118 may be substantially the same.

The lead tabs 120 and 140 may be arranged in parallel with lead tabs 130 and 150, respectively, extending from the internal electrode layers 105 and 115 such that the lead tabs extending from alternating electrode layers 105 and 115 may be aligned in a respective column. For instance, lead tabs 120 and 130 of internal electrode layer 105 may be arranged in a respective stacked configuration while lead tabs 140 and 150 of internal electrode layer 115 may be arranged in a respective stacked configuration.

It will be appreciated that lead tabs 120 connect to external terminal 12 while lead tabs 140 connect to external terminal 14. Accordingly, respective lead tabs 120 will be interdigitated with respective lead tabs 140 in a manner similar to external terminals 12 and 14. The interdigitated lead tabs can provide multiple, adjacent current injection points onto the associated main electrode portions.

Figure 1E:
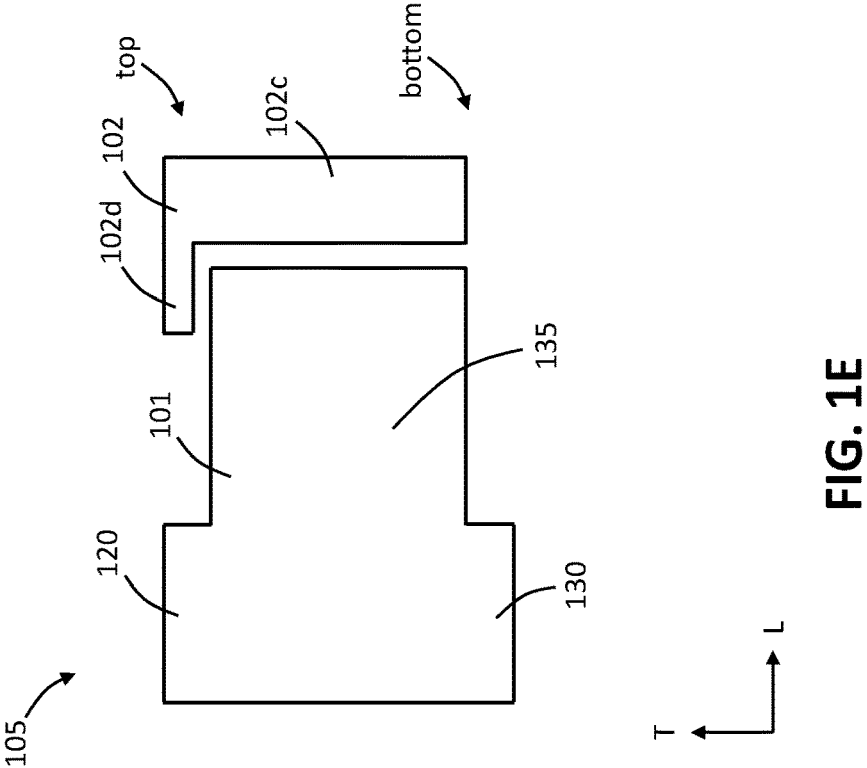
FIG. 1E illustrates a side perspective view of an internal electrode layer of the capacitor of FIG. 1A.
Figure 1D:
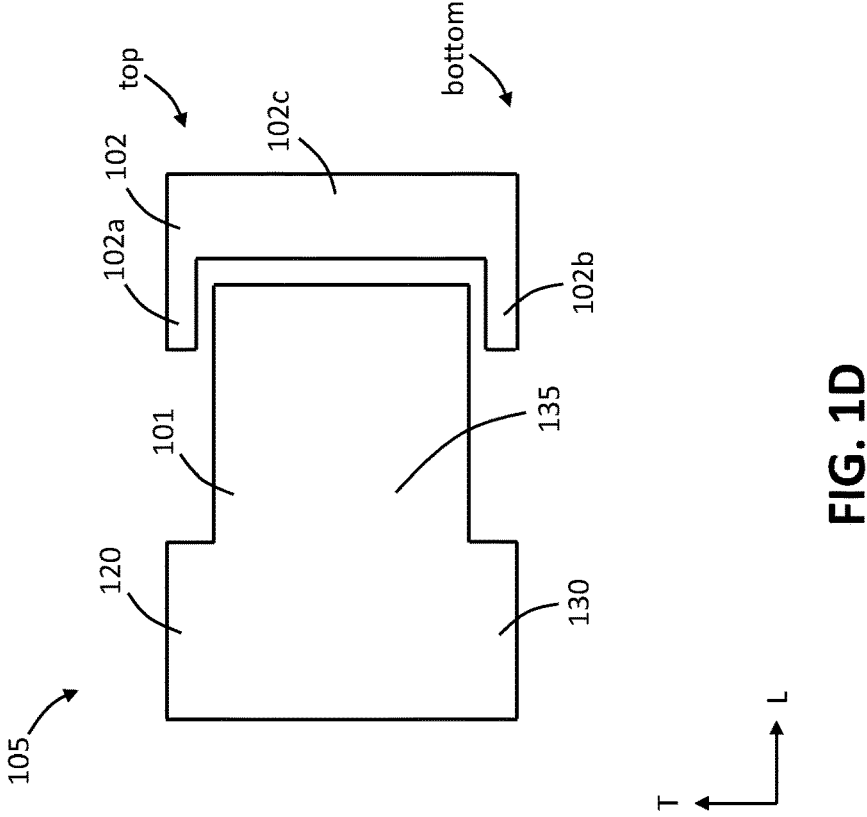
FIG. 1D illustrates a side perspective view of an internal electrode layer of the capacitor of FIG. 1A.

As shown in FIGS. 1B, 1D, and 1E, the second electrode 102 of the first internal electrode layers 105 is co-planar with, or in substantially the same plane as, the first electrode 101, and as shown in FIG. 1C, the second electrode 104 of the second internal electrode layers 115 is co-planar with, or in substantially the same plane as, the first electrode 103. In one embodiment, the first electrode 101 can be viewed as having an end or base portion 109 that extends to and is exposed along a dimension of a surface of an unterminated stack of dielectric and electrode layers. Similarly, the first electrode 103 can be viewed as having an end or base portion 111 that extends to and is exposed along a dimension of a surface of an unterminated stack of dielectric and electrode layers. The respective main body 135, 145 extends from the respective end portion 109, 111 along the longitudinal or length direction L, and the lead tabs 120, 130, 140, 150 extend from the respective end portion 109, 111 along the height direction T. Second electrode 102, 104 also extends to and is exposed along a surface of an unterminated stack of dielectric and electrode layers. Comparing FIGS.

1B and 1C, the second internal electrode layers 115 are configured similar to the first internal electrode layers 105, having a mirrored structure to that of the first internal electrode layers 105.

In the particular embodiment shown in FIGS. 1B and 1C, each second electrode 102, 104 may be generally rectangular. However, in other embodiments, the second electrodes 102, 104 may have other shapes. For example, as shown in FIG. 1D, each second electrode 102 may be generally C-shaped, with a first arm 102a extending from a top of an end or base portion 102c of the second electrode 102 and a second arm 102b extending from a bottom of the end or base portion 102c. Referring to FIG. 1E, as another example, each second electrode 102 may be generally L-shaped, with an arm 102d extending from either a top or a bottom of an end or base portion 102c of the second electrode. In some embodiments of L-shaped second electrodes 102, internal electrode layers 105 having the arm 102d extending from the top of the end or base portion 102c may be alternately stacked with internal electrode layers 105 (as well as dielectric layers and internal electrode layers 115 as described herein) having the arm 102d extending from the bottom of the end or base portion 102c. Although FIGS. 1D and 1E illustrate a second electrode 102 of a first internal electrode layer 105, it will be appreciated that the second electrodes 104 of the second internal electrode layers 115 may be configured similarly to the illustrated second electrode 102, having a C-shape or an L-shape. Of course, in other embodiments, the second electrodes 102, 104 may have any suitable shape.

In some embodiments, the first electrode 101, 103 and the second electrode 102, 104 extend along and/or are exposed along the entire surface of an unterminated stack of dielectric and electrode layers. In other embodiments, the first electrode 101, 103 and the second electrode 102, 104 do not extend along and/or are not exposed along the entire surface of an unterminated stack of dielectric and electrode layers.

The main body 135 of the first electrode 101 has a length 107 in the longitudinal or length direction L, and the main body 145 of the first electrode 103 has a length 108 in the longitudinal or length direction L. The length 107, 108 is the distance of the main body 135, 145 of the first electrode 101, 103 from the side edge adjacent and connecting to the external terminal to the opposing side edge of the main body 135, 145. For instance, the first electrode 101 of a first internal electrode layer 105 may have a length 107 from the side edge 105a to the side edge 105b.

The main body 135, 145 of the first electrode 101, 103 may extend 40% or more, such as 50% or more, such as 55% or more, such as 60% or more, such as 65% or more, such as 70% or more of a length 15 of the capacitor body 16 (i.e., as shown in FIG. 1A, the length between the opposing end surfaces 18c, 18d in the longitudinal or length direction L). The main body 135, 145 of the first electrode 101, 103 may extend less than 100%, such as 90% or less, such as 85% or less, such as 80% or less, such as 75% or less, such as 70% or less, such as 65% or less the length 15 of the body 16 of the capacitor 10. For instance, the main body 135, 145 may extend 50% to less than 100% the length 15 of the capacitor body 16.

As shown in FIGS. 1B-1E, the second electrode 102 has a length 117 extending in the longitudinal or length direction L, and the second electrode 104 has a length 119 extending in the longitudinal or length direction L. The length 117, 119 of each second electrode 102, 104 may be less than the length 15 of the capacitor body 16, i.e., the length 117, 119 of each second electrode 102, 104 may be a fraction or percentage of the length 15 of the capacitor body 16. For example, each second electrode 102, 104 may extend from 5% to 50% the length 15 of the capacitor body 16. As further examples, the second electrode 102, 104 in each internal electrode layer 105, 115 may extend 5% or more, such as 10% or more, such as 15% or more, such as 18% or more, such as 20% or more, such as 22% or more the length 15 of the body 16 of the capacitor 10. Each second electrode 102, 104 may extend 50% or less, such as 40% or less, such as 35% or less, such as 30% or less, such as 25% or less the length 15 of the capacitor body 16.

In addition, within a first internal electrode layer 105, a gap 113 may be present between the main body 135 of the first electrode 101 and the second electrode 102, and within a second internal electrode layer 115, a gap 114 may be present between the main body 145 of the first electrode 103 and the second electrode 104. Such gap 113, 114 may be 2% or more, such as 5% or more, such as 7% or more, such as 9% or more, such as 10% or more, such as 12% or more the length 15 of the capacitor body 16. Such gap 113, 114 may be 40% or less, such as 30% or less, such as 25% or less, such as 20% or less, such as 15% or less, such as 13% or less, such as 11% or less the length 15 of the capacitor body 16. As one example, the gap 113, 114 may be 2% to 40% the length 15 of the capacitor body 16.

A respective gap 113, 114 may be 5% or more, such as 7% or more, such as 10% or more, such as 13% or more, such as 15% or more, such as 18% or more, such as 20% or more the length 107, 108 of the main body 135, 145 of a respective first electrode 101, 103. The gap 113, 114 may be 40% or less, such as 35% or less, such as 30% or less, such as 25% or less, such as 22% or less, such as 20% or less, such as 18% or less, such as 15% or less the length 107, 108 of the main body 135, 145 of the first electrode 101, 103. For instance, the gap 113, 114 may be 5% to 40% the length 107, 108 of the respective main body 135, 145.

Referring back to FIG. 1A, the external terminals 12, 14 may be a first external terminal 12 and a second external terminal 14. The first external terminal 12 is disposed at one end of the capacitor 10, e.g., at the end of the body 16 adjacent the end surface 18c, and the second external terminal 14 is disposed at the opposite end of the capacitor 10 along the longitudinal or length direction L, e.g., the second external terminal 14 is disposed at the end of the body 16 adjacent the end surface 18d. The first external terminal 12 is electrically connected to the first electrode 101 of the first internal electrode layers 105 and the second electrode 104 of the second internal electrode layers 115. The second external terminal 14 is electrically connected to the second electrode 102 of the first internal electrode layers 105 and the first electrode 103 of the second internal electrode layers 115. As previously described, the external terminals of the capacitor 10 wrap around the capacitor body 16 from the top surface 18a to the bottom surface 18b, such that a portion of the first external terminal 12 is formed along the end surface 18c and a portion of the second external terminal 14 is formed along the end surface 18d. The second electrodes 102, 104 can be dummy tabs or electrodes that extend to the respective ends of the body 16 to assist in the formation of the external terminals 12, 14 along the end surfaces 18c, 18d.

Further, in FIG. 1A, the external terminals 12, 14 of the capacitor 10 are spaced apart from the side surfaces of the body 16. That is, the side surfaces of the external terminals 12, 14 are spaced apart from the side surfaces 18e, 18f or the long sides of the body 16, which extend along the longitudinal direction L between the end surfaces 18c, 18d, such that only dielectric material is disposed between the external terminals 12, 14 and the side surfaces 18e, 18f of the body 16. In other embodiments, however, one or both of the external terminals 12, 14 could extend to one or both of the side surfaces of the capacitor body 16 and not be spaced apart from the side surface(s) as shown in FIG. 1A.

As illustrated in FIGS. 1A-1E, the capacitor contains two external terminals formed on the top surface and bottom surface, and each internal electrode layer contains at least one lead tab extending from a top edge and a bottom edge of a main body of the respective layer. However, as indicated above, the present invention is not limited by the number of external terminals and/or the number of lead tabs extending from a top edge and/or bottom edge.

Figure 2A:
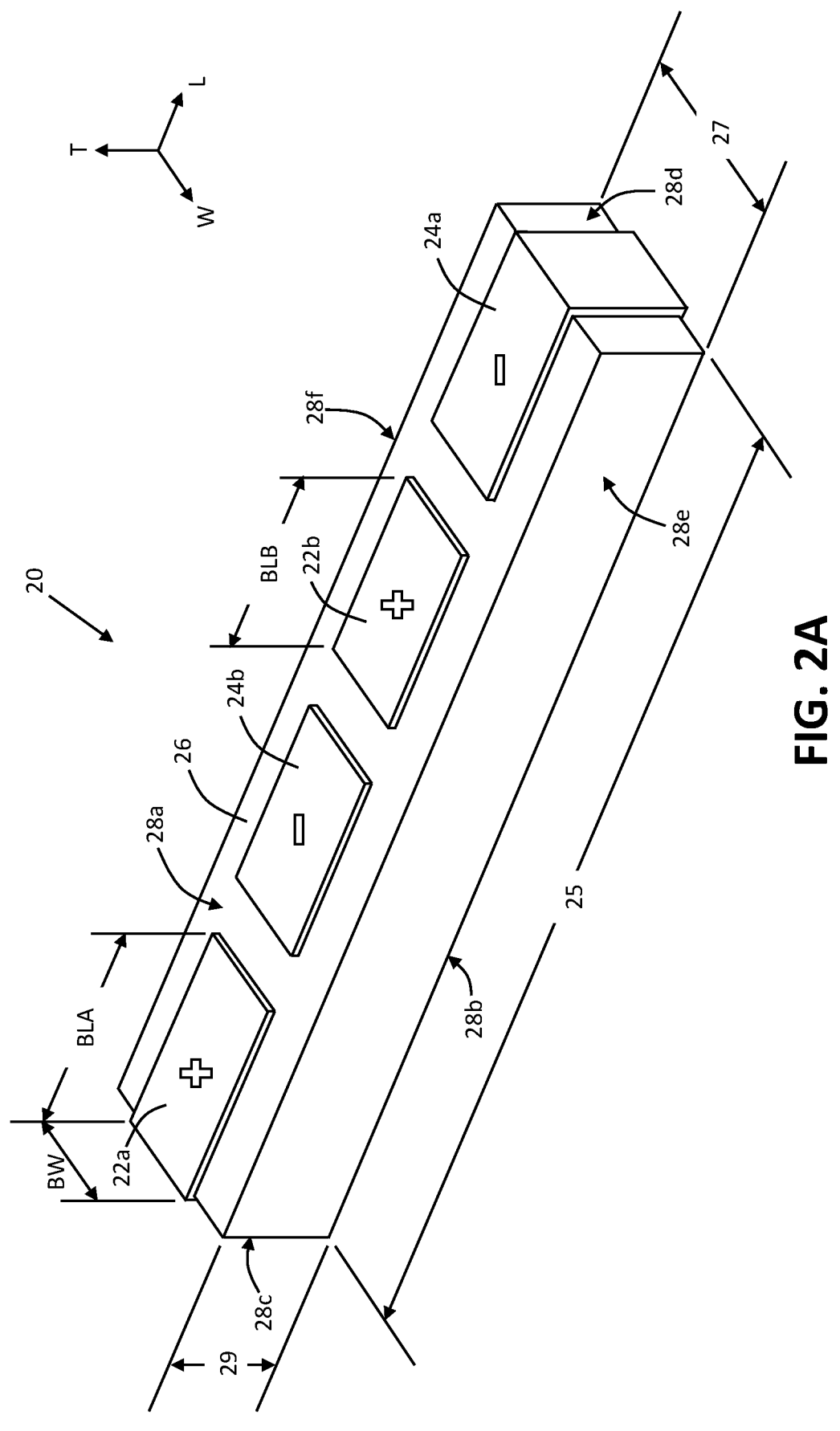
FIG. 2A illustrates a generally top and sides external perspective view of another embodiment of a capacitor including four external terminals in accordance with the present invention.

For instance, FIG. 2A illustrates a capacitor 20 containing four external terminals on each of the top surface and bottom surface and two lead tabs extending from the top edge and the bottom edge of a main body of each internal electrode layer. Similar reference numerals are used in FIGS. 2A-2C as in FIGS. 1A-1E to denote the same or similar features.

As illustrated in FIG. 2A, the capacitor 20 has a 1 by 4 configuration. That is, That is, the capacitor 200 includes four external terminals arranged in a linear fashion in a single dimension on a top surface and a bottom surface of the capacitor. In the depicted embodiment, the capacitor 200 includes external terminals arranged in a linear fashion or a single row along a longitudinal direction L, which may be referred to as a linear terminal arrangement.

In this regard, the capacitor 20 includes a body 26 having a total of four external terminals 22a, 22b, 24a, 24b on a top surface 28a and four corresponding external terminals (not shown) on a bottom surface 28b, where the external terminals 22a, 22b, 24a, 24b on the top surface 28a are electrically connected to the corresponding external terminals 22a, 22b, 24a, 24b on the bottom surface 28b.

Figure 2B:
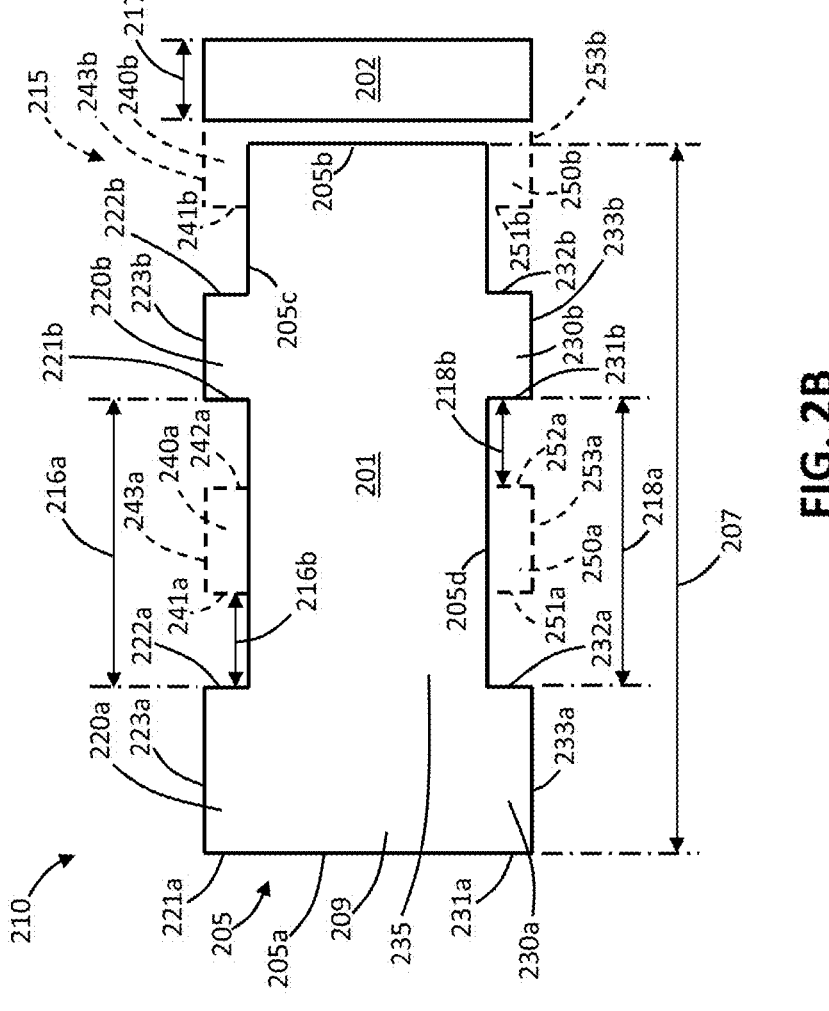
FIG. 2B illustrates a side perspective view of the internal electrode layers of the capacitor of FIG. 2A.
Figure 2C:
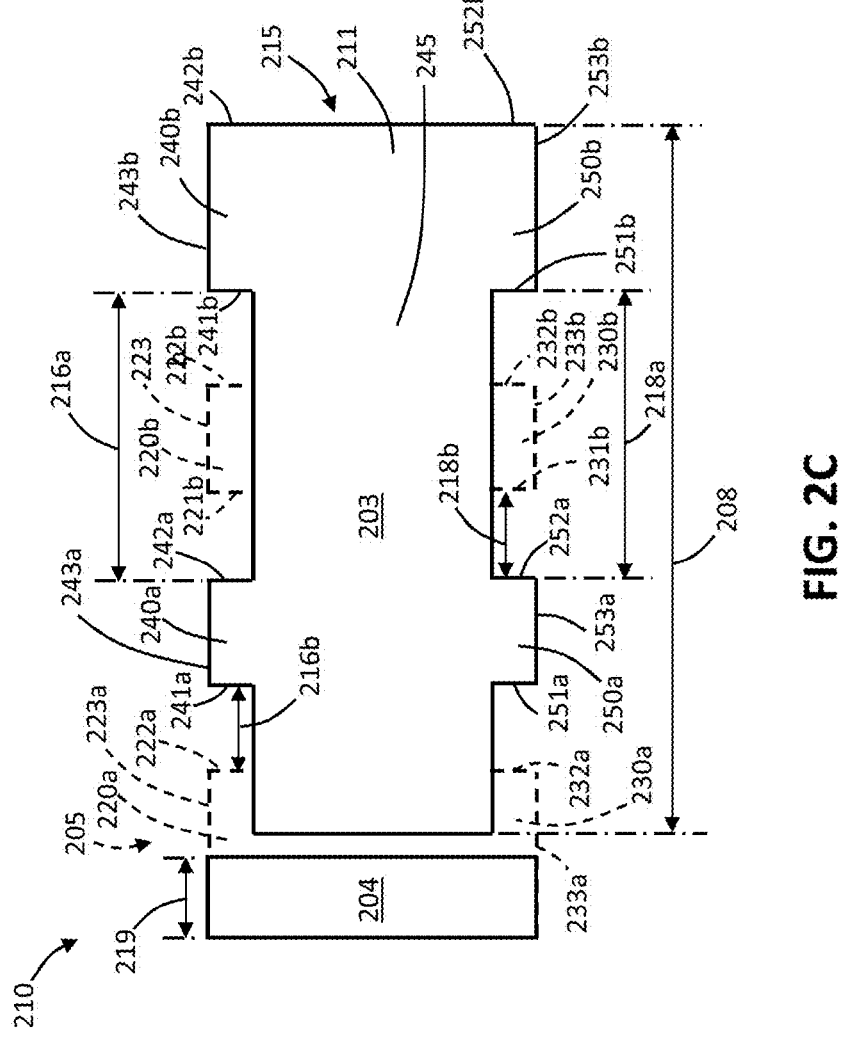
FIG. 2C illustrates a side perspective view of the internal electrode layers of the capacitor of FIG. 2A.

In addition, the capacitor includes terminals along an end surface such that a respective terminal wraps around from the top surface to the bottom surface along the adjacent end surface. In this regard, the external terminals 22a, 22b, 24a, 24b include a first external terminal 22a and a second external terminal 24a. The first external terminal 22a is disposed on the top surface 28a, an end surface 28c, and the bottom surface 28b and is electrically connected to first internal electrode layers 205 (FIGS. 2B, 2C). The second external terminal 24a is disposed on the top surface 28a, an end surface 28d, and the bottom surface 28b and is electrically connected to second internal electrode layers 215 (FIGS. 2B, 2C). The remaining external terminals include a third external terminal 22b on the top surface 28a, a fourth external terminal 24b on the top surface 28a, a fifth external terminal 22b on the bottom surface 28b, and a sixth external terminal 24b on the bottom surface 28b.

Additionally, the capacitor 20 of FIG. 2A includes at least one first polarity terminal and at least one second and opposite polarity terminal on a top surface. Although not shown, the bottom surface includes at least a first polarity terminal and a second and opposite terminal. In particular, as shown in FIG. 2A, the capacitor 20 includes two positive terminals 22a, 22b and two negative terminals 24a, 24b on the top surface 28a.

The body 26 of the capacitor 20 has a length 25 extending in a longitudinal or length direction L, which may be measured from one end surface 28c to the opposing end surface 28d. Further, the body 26 of the capacitor 20 has a width 27 extending in a lateral or width direction W, which may be measured from one side surface 28e to the opposing side surface 28e. Moreover, the body 26 of the capacitor 20 has a height 29 extending in the vertical or height direction T, which may be measured from the top surface 28a to the opposing bottom surface 28b.

As shown in FIG. 2A, the external terminals 22a, 22b, 24a, 24b each have a terminal width BW extending in the lateral or width direction W. The external terminals 22a, 24a also have a terminal length BLA along the top surface 18a, the terminal length BLA extending in the longitudinal or length direction L. Similarly, the external terminals 22b, 24b have a terminal length BLB along the top surface 18a that extends in the longitudinal or length direction L. It will be appreciated that one or both terminals 22a, 24a or one or both terminals 22b, 24b may have a terminal length BLA or BLB, respectively along the bottom surface 18b, which may be the same as or different than the respective terminal length BLA, BLB along the top surface 18a.

Referring to FIGS. 2A-2C, the capacitor 20 includes external terminals 22a, 22b, 24a, 24b and a set of alternating dielectric layers and internal electrode layers 210. Referring particularly to FIGS. 2B and 2C, the set of alternating dielectric layers and internal electrode layers 210 includes first and second internal electrode layers 205, 215 and dielectric layers (not shown) in an alternate arrangement.

In general, each of the first internal electrode layers 205 includes a first electrode 201 and a second electrode 202, and each of the second internal electrode layers 215 includes a first electrode 203 and a second electrode 204. Further, the internal electrode layers 205, 215 include at least one lead tab 220a, 220b, 230a, 230b, 240a, 240b, 250a, 250b extending along the vertical or height direction T from a top edge and a bottom edge of a main body of the first electrodes 201, 203. As such, the lead tabs 220a, 220b, 230a, 230b, 240a, 240b, 250a, 250b extend from the main body perpendicular to a length 207, 208 of the first electrode 201, 203 and the length 25 of the capacitor body 26, where each of the first electrode length 207, 208 and the capacitor body length 25 extend along the longitudinal direction L.

In general, the lead tabs 220a-b, 230a-b, 240a-b, 250a-b of the internal electrode layers 205, 215 extend to the top surface and the bottom surface of the capacitor and assist in forming the external terminals 22a, 22b, 24a, 24b. In this regard, the lead tabs 220a-b, 230a-b, 240a-b, 250a-b may be exposed on the top surface 28a and the bottom surface 28b of the capacitor and allow for connection between the main body of the first electrodes 201, 203 and the external terminals 22a, 22b, 24a, 24b.

For instance, lead tabs 220a-b, 230a-b, 240a-b, 250a-b may contain leading edges 223a, 223b, 233a, 233b, 243a, 243b, 253a, 253b that extend to an edge of a dielectric layer and allow for formation of the external terminals. The leading edges 223a, 223b, 233a, 233b, 243a, 243b, 253a, 253b each extend along the longitudinal direction L and are spaced apart from the main body along the vertical or height direction T. The first external terminal 22a can be electrically connected to the first electrode 201 of the first internal electrode layers 205 along the leading edge 223a of the lead tab 220a and the leading edge 233a of the lead tab 230a. Similarly, the second external terminal 24a can be electrically connected to the second electrode 202 of the first internal electrode layers 205 and the first electrode 203 of the second internal electrode layers 215 along the leading edge 243b of the lead tab 240b and the leading edge 253b of the lead tab 250b.

As illustrated in FIGS. 2B and 2C, a first internal electrode layer 205 includes at least two lead tabs 220a, 220b, 230a, 230b extending from a main body 235 along a top edge 205c and a bottom edge 205d. For example, in the depicted embodiment, two lead tabs 220a, 220b extend from the main body 235 along the top edge 205c, and two lead tabs 230a, 230b extend from the main body 235 along the bottom edge 205d. A second internal electrode layer 215 includes at least two lead tabs 240a, 240b, 250a, 250b extending from a main body 245 along a top edge and a bottom edge. For instance, as shown in FIGS. 2B and 2C, two lead tabs 240a, 240b extend from the main body 245 along the top edge and two lead tabs 250a, 250b extend from the main body along the bottom edge.

As shown in the figures, the main body 235 of the first electrode 201 of first internal electrode layer 205 has a top edge 205c and a bottom edge 205d opposite the top edge 205c along the vertical or height direction T. Each of the top edge 205c and the bottom edge 205d extends along the longitudinal direction L. The main body 235 also has two side edges 205a, 205b that extend along the vertical or height direction T between the top edge 205c and the bottom edge 205d. The side edges 205a, 205b, top edge 205c, and bottom edge 205d define the main body 235 of the first electrode 201. It will be appreciated that the main body 245 of the first electrode 203 of second internal electrode layer 215 is defined by a top edge, bottom edge, and two side edges in the same or a substantially similar manner as the main body 235 of first electrode 201. In general, the main body 235, 245 may have a rectangular configuration or shape.

The lead tabs 220a-b, 230a-b on the top edge 205c and the bottom edge 205d of main body 235 may be aligned in the vertical or height direction T. For example, a lateral edge 221a, 222a of a first lead tab 220a along a top edge 205c may be aligned with a lateral edge 231a, 232a of a first lead tab 230a along a bottom edge 205d opposite the top edge 205c. In addition, such lateral edges 221a, 231a may be aligned with a side edge 205a of the main body 235.

However, it should be understood that both lateral edges 221a, 222a of the first lead tab 220a along a top edge 205c may be aligned with the lateral edges 231a, 232a of a first lead tab 230a along a bottom edge 205d opposite the top edge 205c. In other words, the lateral edges 222a, 232a may be aligned with one another and both lateral edges 222a, 232a may be offset from the side edges 205a, 205b the same distance along the bottom edge 205d and the top edge 205c.

When a top edge 205c and a bottom edge 205d contain at least two lead tabs 220a-b, 230a-b, at least one lateral edge of each lead tab on a top edge 205c may be aligned with a corresponding lateral edge of a lead tab on the bottom edge 205d. Also, both lateral edges of each lead tab on a top edge 205c may be aligned with corresponding lateral edges of the lead tabs on the bottom edge 205d.

Similarly, the lead tabs 240a, 240b, 250a, 250b on the top edge and the bottom edge of main body 245 may be aligned in the vertical or height direction T. That is, a lateral edge 241a, 242a of a first lead tab 240 along a top edge may be aligned with a lateral edge 251a, 252a of a first lead tab 250 along a bottom edge opposite the top edge. In one embodiment, both lateral edges 241a, 242a of the first lead tab 240a along a top edge may be aligned with the lateral edges 251a, 252a of a first lead tab 250a along a bottom edge opposite the top edge. The relationship between lateral edges of a first lead tab on a top edge and a first lead tab on a bottom edge as mentioned with respect to internal electrode layer 205 may also apply to internal electrode layer 215.

With such arrangement, a tab gap may be formed between any of the lead tabs along a top edge 205c of first internal electrode layer 205, of second internal electrode layer 215, or both. For instance, a tab gap may be formed between any of lead tabs 220*a-b*, 240*a-b* that extend from the top edges of the respective internal electrode layers. Additionally, a tab gap may be formed between any of the lead tabs along a bottom edge 205*d* of first internal electrode layer 205, of second internal electrode layer 215, or both. For instance, a tab gap may be formed between any of lead tabs 230*a-b*, 250*a-b* that extend from the bottom edges of the respective internal electrode layers. Also, the size of a tab gap between two respective tabs that extend from a top edge, whether from the same internal electrode layer or adjacent internal electrode layers, may be substantially the same as the size of a tab gap between the corresponding two respective tabs that extend from a bottom edge. For example, a first tab gap 216*a* between lead tabs 220*a* and 220*b* may be substantially the same as a first tab gap 218*a* between lead tabs 230*a* and 230*b*. Similarly, a second tab gap 216*b* between lead tabs 220*a* and 240*a* may be substantially the same as a second tab gap 218*b* between lead tabs 230 and 250*a*.

Any or all of lead tabs 220*a-b*, 240*a-b* may be arranged in parallel with lead tabs 230*a-b*, 250*a-b*, respectively, extending from the layers 205 and 215 such that the lead extending from alternating electrode layers 205 and 215 may be aligned in a respective column. For instance, lead tabs 220*a-b* and 230*a-b* of internal electrode layer 205 may be arranged in a respective stacked configuration while lead tabs 240*a-b* and 250*a-b* of internal electrode layer 215 may be arranged in a respective stacked configuration.

It will be appreciated that lead tabs 220*a*, 220*b* connect to external terminals 22*a*, 22*b*, respectively, while lead tabs 240*a*, 240*b* connect to external terminals 24*a*, 24*b*, respectively. Accordingly, respective lead tabs 220*a-b* will be interdigitated with respective lead tabs 240*a-b* in a manner similar to external terminals 22*a-b* and 24*a-b*. The interdigitated lead tabs can provide multiple, adjacent current injection points onto the associated main electrode portions.

As shown in FIGS. 2B and 2C, the second electrode 202 of the first internal electrode layers 205 is co-planar with, or in substantially the same plane as, the first electrode 201, and the second electrode 204 of the second internal electrode layers 215 is co-planar with, or in substantially the same plane as, the first electrode 203. In one embodiment, the first electrode 201 can be viewed as having an end or base portion 209 that extends to and is exposed along a dimension of a surface of an unterminated stack of dielectric and electrode layers. Similarly, the first electrode 203 can be viewed as having an end or base portion 211 that extends to and is exposed along a dimension of a surface of an unterminated stack of dielectric and electrode layers. The respective main body 235, 245 extends from the respective end portion 209, 211 along the longitudinal or length direction L, and the lead tabs 220*a*, 230*a*, 240*b*, 250*b* extend from the respective end portion 209, 211 along the height direction T. Like the first electrode 201, 203, second electrode 202, 204 also extends to and is exposed along a surface of an unterminated stack of dielectric and electrode layers. Comparing FIGS. 2B and 2C, the second internal electrode layers 215 are configured similar to the first internal electrode layers 205, having a mirrored structure to that of the first internal electrode layers 205.

In the particular embodiment shown in FIGS. 2B and 2C, each second electrode 202, 204 may be generally rectangular. However, in other embodiments, the second electrodes 202, 204 may have other shapes. For example, second electrodes 202, 204 may be generally C-shaped, or second electrodes 202, 204 may be generally L-shaped, e.g., as described above with respect to capacitor 10. Of course, in other embodiments, the second electrodes 202, 204 may have any suitable shape.

In some embodiments, the first electrode 201, 203 and the second electrode 202, 204 extend along and/or are exposed along the entire surface of an unterminated stack of dielectric and electrode layers. In other embodiments, the first electrode 201, 203 and the second electrode 202, 204 do not extend along and/or are not exposed along the entire surface of an unterminated stack of dielectric and electrode layers.

The main body 235 of the first electrode 201 has a length 207 in the longitudinal or length direction L, and the main body 245 of the first electrode 203 has a length 208 in the longitudinal or length direction L. The length 207, 208 is the distance of the main body 235, 245 of the first electrode 201, 203 from the side edge adjacent and connecting to the external terminal to the opposing side edge of the main body 235, 245. For instance, the first electrode 201 of a first internal electrode layer 205 may have a length 207 from the side edge 205*a* to the side edge 205*b*.

The main body 235, 245 of the first electrode 201, 203 may extend 40% or more, such as 50% or more, such as 55% or more, such as 60% or more, such as 65% or more, such as 70% or more of a length 25 of the capacitor body 26 (i.e., as shown in FIG. 2A, the length between the opposing end surfaces 28*c*, 28*d* in the longitudinal or length direction L). The main body 235, 245 of the first electrode 201, 203 may extend less than 100%, such as 90% or less, such as 85% or less, such as 80% or less, such as 75% or less, such as 70% or less, such as 65% or less the length 25 of the body 26 of the capacitor 20. For instance, the main body 235, 245 may extend 50% to less than 100% the length 25 of the capacitor body 26.

As shown in FIGS. 2B and 2C, the second electrode 202 has a length 217 extending in the longitudinal or length direction L, and the second electrode 204 has a length 219 extending in the longitudinal or length direction L. The length 217, 219 of each second electrode 202, 204 may be less than the length 25 of the capacitor body 16, i.e., the length 217, 219 of each second electrode 202, 204 may be a fraction or percentage of the length 25 of the capacitor body 26. For example, each second electrode 202, 204 may extend from 5% to 50% the length 25 of the capacitor body 26. As further examples, the second electrode 202, 204 in each internal electrode layer 205, 215 may extend 5% or more, such as 10% or more, such as 15% or more, such as 18% or more, such as 20% or more, such as 22% or more the length 25 of the body 26 of the capacitor 20. Each second electrode 202, 204 may extend 50% or less, such as 40% or less, such as 35% or less, such as 30% or less, such as 25% or less the length 25 of the capacitor body 26.

In addition, within a first internal electrode layer 205, a gap 213 may be present between the main body 235 of the first electrode 201 and the second electrode 202, and within a second internal electrode layer 215, a gap 214 may be present between the main body 245 of the first electrode 203 and the second electrode 204. Such gap 213, 214 may be 2% or more, such as 5% or more, such as 7% or more, such as 9% or more, such as 10% or more, such as 12% or more the length 25 of the capacitor body 26. Such gap 213, 214 may be 40% or less, such as 30% or less, such as 25% or less, such as 20% or less, such as 15% or less, such as 13% or less, such as 11% or less the length 25 of the capacitor body 26. As one example, the gap 213, 214 may be 2% to 40% the length 25 of the capacitor body 26.

A respective gap 213, 214 may be 5% or more, such as 7% or more, such as 10% or more, such as 13% or more, such as 15% or more, such as 18% or more, such as 20% or more the length 207, 208 of the main body 235, 245 of a respective first electrode 201, 203. The gap 213, 214 may be 40% or less, such as 35% or less, such as 30% or less, such as 25% or less, such as 22% or less, such as 20% or less, such as 18% or less, such as 15% or less the length 207, 108 of the main body 235, 245 of the first electrode 201, 203. For instance, the gap 213, 214 may be 5% to 40% the length 207, 208 of the respective main body 235, 245.

Referring back to FIG. 2A, the external terminals 22a, 22b, 24a, 24b may include a first external terminal 22a disposed at one end of the capacitor 20, e.g., at the end of the body 26 adjacent the end surface 28c, and a second external terminal 24a disposed at the opposite end of the capacitor 20 along the longitudinal or length direction L, e.g., the second external terminal 24a is disposed at the end of the body 26 adjacent the end surface 28d. The first external terminal 22a is electrically connected to the first electrode 201 of the first internal electrode layers 205 and the second electrode 204 of the second internal electrode layers 215. The second external terminal 24a is electrically connected to the second electrode 202 of the first internal electrode layers 205 and the first electrode 203 of the second internal electrode layers 215. As previously described, the first and second external terminals 22a, 24a (or the end external terminals) of the capacitor 20 wrap around the capacitor body 26 from the top surface 28a to the bottom surface 28b, such that a portion of the first external terminal 22a is formed along the end surface 28c and a portion of the second external terminal 24a is formed along the end surface 28d. The second electrodes 202, 204 can be dummy tabs or electrodes that extend to the respective ends of the body 26 to assist in the formation of the external terminals 22a, 24a along the end surfaces 28c, 28d.

Further, in FIG. 2A, the external terminals 22a, 22b, 24a, 24b of the capacitor 20 are spaced apart from the side surfaces of the body 26. That is, the side surfaces of the external terminals 22a-b, 24a-b are spaced apart from the side surfaces 28e, 28f or the long sides of the body 26, which extend along the longitudinal direction L between the end surfaces 28c, 28d, such that only dielectric material is disposed between the external terminals 22a-b, 24a-b and the side surfaces 28e, 28f of the body 26. In other embodiments, however, one or more of the external terminals 22a-b, 24a-b could extend to one or both of the side surfaces of the capacitor body 26 and not be spaced apart from the side surface(s) as shown in FIG. 2A.

As illustrated in FIGS. 2A-2C, the capacitor contains four external terminals formed on the top surface and bottom surface, with two external terminals also extending along respective end surfaces. Further, each internal electrode layer contains at least two lead tabs extending from a top edge and a bottom edge of a main body of the respective layer. However, as indicated above, the present invention is not limited by the number of external terminals, the number of lead tabs extending from a top edge and/or bottom edge, and/or the number of sets of alternating dielectric layers and internal electrode layers.

Additionally, the embodiments of the figures employ only two internal electrode layers per set of alternating dielectric layers and internal electrode layers. However, it should be understood that the present invention may include any number of internal electrode layers per set as indicated herein and is not necessarily limited.

In general, the present invention provides a capacitor having a unique configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, Z5U, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The internal electrode layers may be formed from any of a variety of different metals as is known in the art. The internal electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. In one particular embodiment, the internal electrode layers may comprise nickel or an alloy thereof.

External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

The external terminals may be formed such that the external terminal is a thin-film plating of a metal. Such thin-film plating can be formed by depositing a conductive material, such as a conductive metal, on an exposed portion of an internal electrode layer. For instance, a leading edge of an internal electrode layer may be exposed such that it may allow for the formation of a plated termination.

The external terminals may have an average thickness of about 50 μm or less, such as about 40 μm or less, such as about 30 μm or less, such as about 25 μm or less, such as about 20 μm or less to about 5 μm or more, such as about 10 μm or more, such as about 15 μm or more. For instance, the external terminals may have an average thickness of from about 5 μm to about 50 μm, such as from about 10 μm to about 40 μm, such as from about 15 μm to about 30 μm, such as from about 15 μm to about 25 μm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the lead tabs of the internal electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the lead tabs of the internal electrode layers.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of lead tabs of a given polarity of the respective internal electrode layers within a set of alternating dielectric layers and internal electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the lead tabs of the internal electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the lead tabs.

Additionally, prior to plating or any other pretreatment steps, an initial cleaning step may be employed. Such step may be employed to remove any oxide buildup that forms on the exposed lead tabs of the internal electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the lead tabs of the internal electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized and thus are not necessarily limited.

Also, in lieu of or in addition to the aforementioned activation step, the activation dopant may be introduced into the conductive material when forming the internal electrode layers of the capacitor. For instance, when the internal electrode layer comprises nickel and the activation dopant comprises palladium, the palladium dopant may be introduced into the nickel ink or composition that forms the internal electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed as desired or necessary. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal comprises at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. Further, the materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Alternatively, another plating layer, such as the second plating layer, may comprise cooer or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel or copper) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the lead tabs of the internal electrode layers. Such phenomena may be referred to as "self-determining" because the formation of the external plated terminals is determined by the configuration of the exposed conductive metal of the internal electrode layers at the selected peripheral locations on the capacitor.

Additional aspects of the above-described technology for forming thin-film plated terminations are described in U.S. Pat. No. 7,177,137 to Ritter et al. and U.S. Pat. No. 7,463,474 to Ritter et al., which are incorporated by reference herein for all purposes. It should be appreciated that additional technologies for forming capacitor terminals may also be within the scope of the present technology. Exemplary alternatives include, but are not limited to, the formation of terminations by plating, magnetism, masking, electrophoretics/electrostatics, sputtering, vacuum deposition, printing or other techniques for forming both thick-film conductive layers or thin-film conductive layers.

Further, the capacitor may then be subjected to a solder mask. For instance, this can allow the capacitor to be coated. Without intending to be limited, such mask may assist in prevention of oxidation of the plated layers, such as the copper plated layer, in particular when such layer is the final plating layer of the external terminal. Such solder mask material may not necessarily be limited by the present invention. For instance, such material may include any of those mentioned above with respect to the solder barrier layer. Additionally or alternatively, such material may include an epoxy, such as a liquid epoxy which is then cured.

When providing such material on the capacitor, it may be required to access the plating layer and external terminal in order to form an electrical connection. In this regard, a laser may be utilized to form a hole through the mask layer. Such hole may then be filled with a conductive material, such as copper. This can then be utilized to form an electrical connection with the capacitor.

Figure 3:
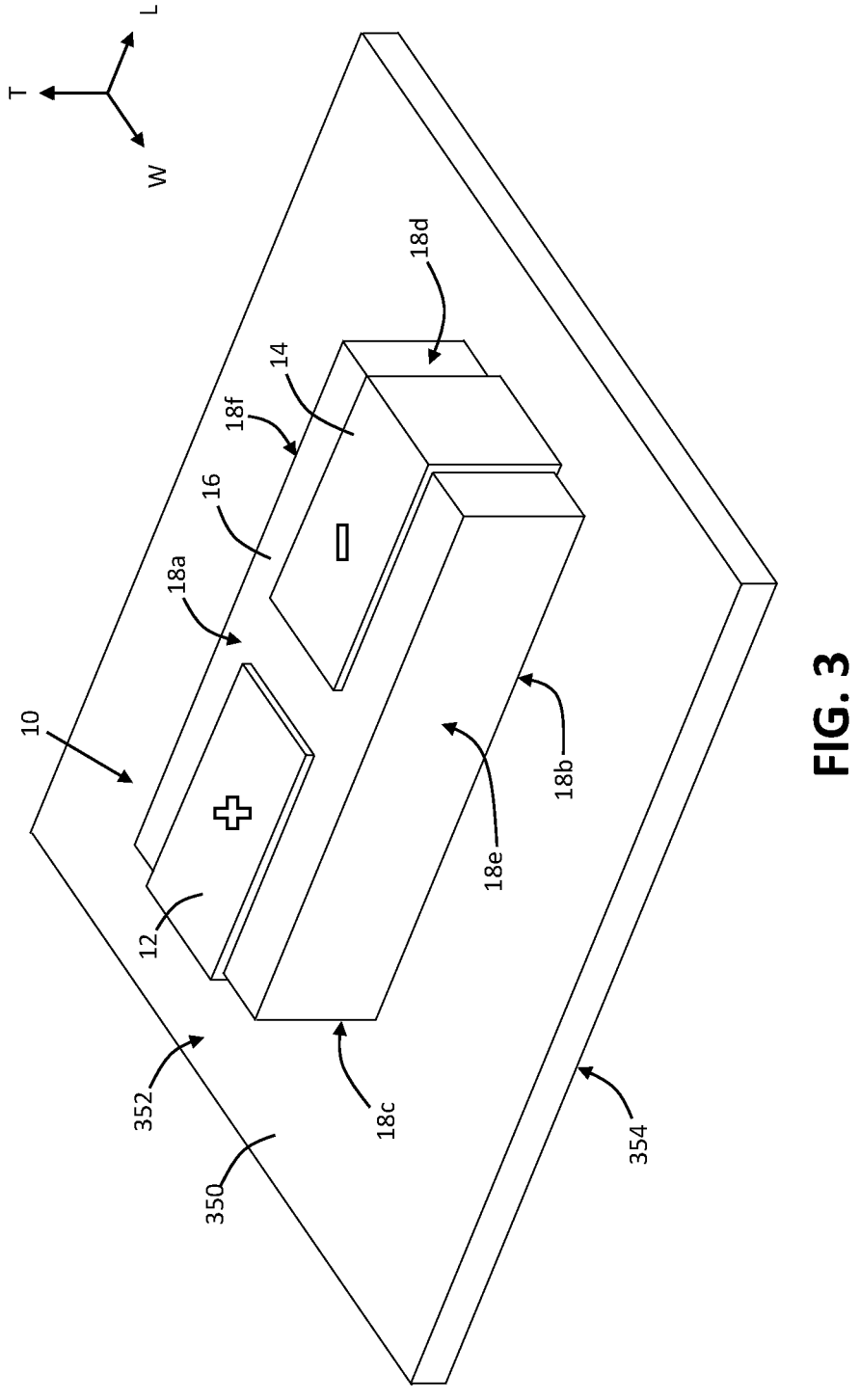
FIG. 3 illustrates a perspective view of the capacitor of FIG. 1A mounted on a mounting surface in accordance with the present invention.
Figure 4:
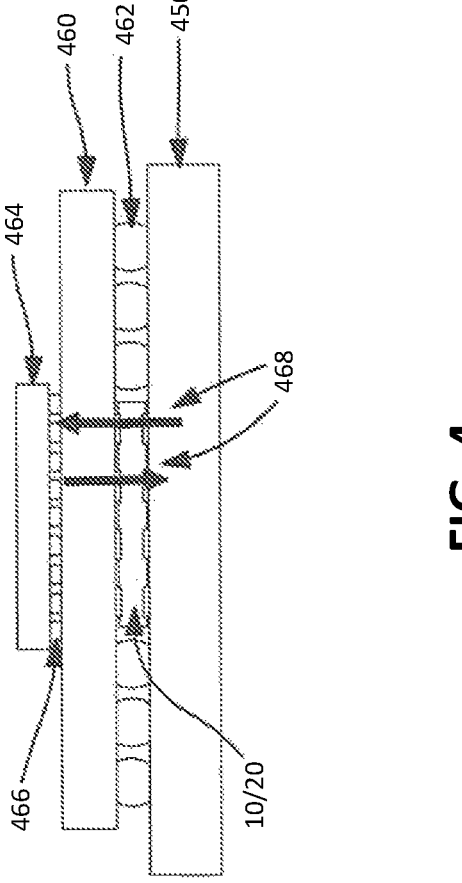
FIG. 4 illustrates a side view of a printed circuit board and integrated circuit package containing a capacitor in accordance with the present invention.

Turning to FIGS. 3 and 4, the capacitor as disclosed herein can be mounted using various means. For instance, the capacitor can be mounted onto a circuit board that contains a substrate (e.g., insulating layer) having an upper surface and a lower surface. Referring to FIG. 3, a capacitor 10 such as shown in FIG. 1A is mounted onto a circuit board 350 having an upper surface 352 and a lower surface 354. The circuit board 350 has a plurality of electrical current paths defined therein. The external terminals 12, 14 of the capacitor 10 are in respective electrical communication with the predetermined current paths of the circuit board 350. In addition, the external terminals 12, 14 of the capacitor 10 can be physically connected to the circuit board 350 using any method generally known in the art, such as general soldering techniques. It will be appreciated that the capacitor 10 is used by way of example only; in other embodiments, the capacitor 20 can be mounted to a mounting surface such as circuit board 350.

As illustrated in FIG. 4, an integrated circuit package 460 may also be provided on a circuit board 450. The integrated circuit package 460 may be connected to the circuit board 450 using a ball grid array 462. The circuit board may further comprise a processor 464. The processor 464 may be connected to the integrated circuit package 460 also using a ball grid array 466.

In general, the ball grid array 462 may be configured such that the pitch is 1.5 mm or less, such as 1.25 mm or less, such as 1 mm or less, such as 0.8 mm or less, such as 0.6 mm or less and 0.4 mm or more, such as 0.5 mm or more, such as 0.6 mm or more.

In addition, the integrated circuit package 460 may also be connected to the circuit board 450 using a capacitor as defined herein. In this regard, the internal electrode layers of the capacitor 10/20 may be positioned such that they are orthogonal to a horizontal plane of the circuit board 450 and integrated circuit package 460. In other words, the internal electrode layers of the capacitor 10/20 may be positioned such that they are substantially nonparallel with the circuit board 450. For instance, the capacitor 10/20 may be positioned between the integrated circuit package 460 and the circuit board 450 such that the capacitor 10/20 is "sandwiched" between the two components. In this regard, the capacitor 10/20 is directly connected to the integrated circuit package 460 and the circuit board 450. For instance, the capacitor 10/20 can be connected (e.g., physically and/or electrically) to the circuit board 450 and/or circuit package 460 using any method generally known in the art, such as general soldering techniques.

By employing the capacitor in the aforementioned arrangement, the capacitor 10/20 may allow for removal of some of the original ball grid array 462. However, the capacitor 10/20 may still be surrounded by a ball grid array 462 as illustrated in FIG. 4.

Thus, as shown in FIG. 4, the capacitor 10/20 of the present invention can be directly connected to an integrated circuit package 460 and a circuit board 450, such as a printed circuit board. This direct connection allows for current 468 to flow through the capacitor thereby providing a direct power ground connection.

In addition to the above, although not illustrated herein, in one embodiment, the integrated circuit package itself may include the multilayer capacitor. In this regard, the capacitor may be embedded directly into the package. Such incorporation of the capacitor may allow for a reduction in size, which can be beneficial for various electronic applications.

While the aforementioned provides one example of a means for mounting the capacitor as disclosed herein, it should be understood that other methods may also be utilized. For instance, the capacitor may be mounted via land grid array configuration. The capacitor may also be embedded in another substrate or component.

In the embodiments referenced above, the internal electrode layers are generally oriented in a vertical configuration. For example, an internal electrode layer may have a length that is perpendicular to a direction along which one or more tabs extend to assist in the formation of external terminals. As another example, the one or more tabs extend from a main body of an internal electrode layer in along a direction that is perpendicular to a surface to which the capacitor is mounted or to a substrate within which the capacitor is embedded. In some embodiments, however, it may be suitable to use other geometric configurations, such as a horizontal configuration.

These and other modifications and variations of the present invention may be practiced by those of ordinary skill in the art, without departing from the spirit and scope of the present invention. In addition, it should be understood that aspects of the various embodiments may be interchanged both in whole or in part. Further, those of ordinary skill in the art will appreciate that the foregoing description is by way of example only and is not intended to limit the invention so further described in such appended claims.

The invention claimed is:

1. A multilayer capacitor comprising:

a body having a length extending in a longitudinal direction, a width extending in a lateral direction, and a height extending in a vertical direction, the body containing alternating dielectric layers and internal electrode layers, the internal electrode layers including first internal electrode layers and second internal electrode layers, each internal electrode layer including:

a first electrode having a main body defined by a top edge extending along the longitudinal direction, a bottom edge opposite the top edge along the height direction and extending along the longitudinal direction, and two side edges extending along the height direction between the top edge and the bottom edge, at least one lead tab extending from the top edge of the main body, the at least one lead tab extending from the top edge along the height direction, the at least one lead tab extending from the top edge having a leading edge extending along the longitudinal direction and spaced apart from the main body along the height direction, the leading edge of the at least one lead tab having a top leading edge length in the longitudinal direction, at least one lead tab extending from the bottom edge of the main body, the at least one lead tab extending from the bottom edge along the height direction, the at least one lead tab extending from the bottom edge having a leading edge extending along the longitudinal direction and spaced apart from the main body along the height direction, the leading edge of the at least one lead tab having a bottom leading edge length in the longitudinal direction, and a second electrode co-planar with the first electrode, the second electrode defined by a top edge extending along the longitudinal direction, a bottom edge opposite the top edge along the height direction and extending along the longitudinal direction, and two side edges extending along the height direction between the top edge and the bottom edge, at least one of the top edge or the bottom edge of the second electrode having a second electrode length in the longitudinal direction that is less than at least one of the top leading edge length or the bottom leading edge length; and external terminals electrically connected to the internal electrode layers, wherein the external terminals include a first external terminal and a second external terminal, wherein each of the first external terminal and the second external terminal is formed on a top surface of the multilayer capacitor, a bottom surface of the multilayer capacitor opposing the top surface of the multilayer capacitor along the height direction, and an end surface extending between the top surface and the bottom surface, wherein the first external terminal is electrically connected to the first electrode of the first internal electrode layers along the leading edge of the at least one lead tab extending from the top edge and the leading edge of the at least one lead tab extending from the bottom edge, the first external terminal also electrically connected to the second electrode of the second internal electrode layers, and wherein the second external terminal is electrically connected to the second electrode of the first internal electrode layers and the first electrode of the second internal electrode layers along the leading edge of the at least one lead tab extending from the top edge and the leading edge of the at least one lead tab extending from the bottom edge.

2. The multilayer capacitor of claim 1, wherein the external terminals are arranged in a linear fashion on the top surface and the bottom surface of the body.

3. The multilayer capacitor of claim 2, wherein the body has a pair of side surfaces opposing one another along a lateral direction, and wherein the external terminals are spaced apart from the side surfaces of the body such that only dielectric material is disposed between the external terminals and the side surfaces of the body.

4. The multilayer capacitor of claim 1, wherein the second electrode is of a generally rectangular configuration.

5. The multilayer capacitor of claim 1, wherein the second electrode is of a generally C-shaped configuration.

6. The multilayer capacitor of claim 1, wherein the second electrode is of a generally L-shaped configuration.

7. The multilayer capacitor of claim 1, wherein the main body of the first electrode extends 40% to less than 100% a length of the body of the capacitor.

8. The multilayer capacitor of claim 7, wherein the main body extends 50% to less than 100% the length of the body of the capacitor.

9. The multilayer capacitor of claim 1, wherein a gap is present between the first electrode and the second electrode, and wherein the gap is from 2% to 40% a length of the body of the capacitor.

10. The multilayer capacitor of claim 1, wherein a gap is present between the first electrode and the second electrode, and wherein the gap is from 5% to 40% of a length of the main body of the first electrode.

11. The multilayer capacitor of claim 1, wherein the second electrode extends from 5% to 50% a length of the body of the capacitor.

12. The multilayer capacitor of claim 1, wherein the first internal electrode layer and the second internal electrode layer are interleaved in an opposed relation and a dielectric layer is positioned between the first internal electrode layer and the second internal electrode layer.

13. The multilayer capacitor of claim 12, wherein the dielectric layers comprise a ceramic.

14. The multilayer capacitor of claim 1, wherein the at least one lead tab extending from the top edge of the main body and the at least one lead tab extending from the bottom edge of the main body includes a lateral edge aligned with a side edge of the main body.

15. The multilayer capacitor of claim 1, wherein each internal electrode layer includes at least two lead tabs extending from the top edge, the bottom edge, or both the top edge and the bottom edge, the two lead tabs including a first lead tab and a second lead tab.

16. The multilayer capacitor of claim 15, wherein at least one lateral edge of the first lead tab and at least one lateral edge of the second lead tab on a top edge are substantially aligned with at least one lateral edge of the first lead tab and at least one lateral edge of the second lead tab on a top edge respectively.

17. The multilayer capacitor of claim 15, wherein both lateral edges of the first lead tab and both lateral edges of the second lead tab on a top edge are substantially aligned with both lateral edges of the first lead tab and both lateral edges of a second lead tab on the top edge.

18. The multilayer capacitor of claim 1, wherein at least one lateral edge of the lead tab on the top edge is substantially aligned with at least one lateral edge of the lead tab on the bottom edge.

19. The multilayer capacitor of claim 1, wherein both lateral edges of the lead tab on the top edge are substantially aligned with both lateral edges of the lead tab on the bottom edge.

20. The multilayer capacitor of claim 1, wherein the internal electrode layers comprise a conductive metal.

21. The multilayer capacitor of claim 1, wherein the external terminals include an electroplated layer.

22. The multilayer capacitor of claim 1, wherein the external terminals include an electroless plated layer.

23. The multilayer capacitor of claim 1, wherein the external terminals include an electroless plated layer and an electroplated layer.

24. The multilayer capacitor of claim 1, wherein the external terminals include a first electroless plated layer, a second electroplated layer, and a third electroplated layer.

25. The multilayer capacitor of claim 24, wherein the first electroless plated layer includes copper, the second electroplated layer includes nickel, and the third electroplated layer includes tin.

26. The multilayer capacitor of claim 1, wherein the capacitor includes at least three sets of alternating dielectric layers and internal electrode layers.

27. A circuit board including the multilayer capacitor of claim 1 positioned on the circuit board.

28. The circuit board of claim 27, wherein the board further comprises an integrated circuit package and wherein the multilayer capacitor is positioned between the circuit board and the integrated circuit package in a vertical direction such that the circuit board, the multilayer capacitor, and the integrated circuit package are present in a stacked arrangement.

29. The circuit board of claim 28, wherein the multilayer capacitor is directly connected to the circuit board and the integrated circuit package.

30. An integrated circuit package containing the multilayer capacitor of claim 1.

31. The multilayer capacitor of claim 1, wherein the internal electrode layers include only the first internal electrode layers and the second internal electrode layers, wherein each first internal electrode layer includes the first electrode and the second electrode, and wherein each second internal electrode layer includes the first electrode and the second electrode.

* * * * *